United States Patent
Cho et al.

(10) Patent No.: US 12,082,461 B2
(45) Date of Patent: Sep. 3, 2024

(54) DISPLAY APPARATUS INCLUDING CONNECTING ELECTRODE LAYER

(71) Applicant: Samsung Display Co., Ltd., Yongin-si (KR)

(72) Inventors: Seunghwan Cho, Yongin-si (KR); Jiryun Park, Yongin-si (KR); Seokje Seong, Yongin-si (KR); Inhyuck Yeo, Yongin-si (KR); Wonsuk Choi, Yongin-si (KR); Yoonsun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 371 days.

(21) Appl. No.: 17/525,174

(22) Filed: Nov. 12, 2021

(65) Prior Publication Data
US 2022/0336563 A1 Oct. 20, 2022

(30) Foreign Application Priority Data
Apr. 19, 2021 (KR) .................. 10-2021-0050708

(51) Int. Cl.
*H01L 27/14* (2006.01)
*G09G 3/3283* (2016.01)
(Continued)

(52) U.S. Cl.
CPC ......... *H10K 59/131* (2023.02); *G09G 3/3283* (2013.01); *H10K 59/1213* (2023.02);
(Continued)

(58) Field of Classification Search
CPC ............. H10K 59/131; H10K 59/1213; H10K 59/1216; H10K 59/124; H10K 77/111; H10K 2102/311; H10K 59/123; H10K 59/122; G09G 3/3283; G09G 2300/0426; G09G 2300/0842; G09G 2320/0233; G09G 3/2092; G09G 3/3241; G09G 2310/0251; H01L 27/1225; H01L 27/124;
(Continued)

(56) References Cited

U.S. PATENT DOCUMENTS 10,761,386 B2  9/2020  Zhang et al.
2020/0373369 A1* 11/2020  Kang ................ H10K 77/111

FOREIGN PATENT DOCUMENTS

KR  10-2020-0010697  1/2020

* cited by examiner

*Primary Examiner* — Tan N Tran
(74) *Attorney, Agent, or Firm* — KILE PARK REED & HOUTTEMAN PLLC

(57) ABSTRACT

A display apparatus includes a first semiconductor layer disposed on a substrate; a first gate layer disposed on the first semiconductor layer, the first gate layer including a driving gate electrode; a second gate layer disposed on the first gate layer, the second gate layer including a capacitor upper electrode; a first connecting electrode layer disposed on the second gate layer, the first connecting electrode layer including a transfer wiring; a second connecting electrode layer disposed on the first connecting electrode layer, the second connecting electrode layer including a horizontal connection wiring extending in a first direction; and a third connecting electrode layer disposed on the second connecting electrode layer, the third connecting electrode layer including a vertical connection wiring extending in a second direction that intersects the first direction.

26 Claims, 25 Drawing Sheets

(51) Int. Cl.
*H10K 59/121* (2023.01)
*H10K 59/131* (2023.01)
*H01L 27/12* (2006.01)
*H01L 29/786* (2006.01)

(52) U.S. Cl.
CPC . *H10K 59/1216* (2023.02); *G09G 2300/0426* (2013.01); *G09G 2300/0842* (2013.01); *G09G 2320/0233* (2013.01); *H01L 27/1225* (2013.01); *H01L 27/124* (2013.01); *H01L 27/1251* (2013.01); *H01L 27/1255* (2013.01); *H01L 29/78675* (2013.01); *H01L 29/7869* (2013.01)

(58) Field of Classification Search
CPC ............. H01L 27/1251; H01L 27/1255; H01L 29/78675; H01L 29/7869
USPC ...................................................... 257/59, 72
See application file for complete search history.

DISPLAY APPARATUS INCLUDING CONNECTING ELECTRODE LAYER

CROSS-REFERENCE TO RELATED APPLICATION(S)

This application claims priority to and the benefit of Korean Patent Application No. 10-2021-0050708 under 35 U.S.C. § 119, filed on Apr. 19, 2021, in the Korean Intellectual Property Office (KIPO), the entire contents of which are incorporated herein by reference.

BACKGROUND

1. Technical Field

One or more embodiments relate to a display apparatus, and more specifically, to a display apparatus which is capable of display high-quality images and in which an area of a dead space is reduced.

2. Description of the Related Art

In general, in a display apparatus such as an organic light-emitting display apparatus, a thin film transistor is arranged in each pixel or sub-pixel (or "(sub-)pixel") in order to control luminance, etc. of each (sub-)pixel. The thin film transistor controls the luminance, etc. of the corresponding (sub-)pixel according to a data signal transferred thereto.

The data signal is transferred to each (sub-)pixel via a data line from a driver located in a peripheral area on an outer portion of a display area.

In a display apparatus according to the related art, a region in which a driver, etc. are located has a large area, or a region from the driver to a display area has a large area. Accordingly, an area of a dead space in which display devices are not arranged is excessively large.

SUMMARY

One or more embodiments include a display apparatus which is capable of displaying high quality images and in which an area of a dead space may be reduced. However, the above technical features are examples, and the scope of the disclosure is not limited thereto.

Additional aspects will be set forth in part in the description which follows and, in part, will be apparent from the description, or may be learned by practice of the presented embodiments of the disclosure.

According to an embodiment, a display apparatus may include a first semiconductor layer disposed on a substrate, a first gate layer disposed on the first semiconductor layer, the first gate layer including a driving gate electrode, a second gate layer disposed on the first gate layer, the second gate layer including a capacitor upper electrode, a first connecting electrode layer disposed on the second gate layer, the first connecting electrode layer including a transfer wiring, a second connecting electrode layer disposed on the first connecting electrode layer, the second connecting electrode layer including a horizontal connection wiring extending in a first direction, and a third connecting electrode layer disposed on the second connecting electrode layer, the third connecting electrode layer including a vertical connection wiring extending in a second direction that intersects the first direction.

The display apparatus may further include a second semiconductor layer between the second gate layer and the first connecting electrode layer, and a third gate layer between the second semiconductor layer and the first connecting electrode layer, the third gate layer including a compensation gate electrode.

The third gate layer may include a gate wiring extending in the first direction.

The gate wiring may intersect the vertical connection wiring.

The first semiconductor layer may include polysilicon and the second semiconductor layer may include an oxide semiconductor.

The third connecting electrode layer may include a data wiring extending in the second direction, and the vertical connection wiring may be electrically connected to the data wiring and the horizontal connection wiring.

The substrate may include a display area, and a peripheral area adjacent to the display area, and the vertical connection wiring may be electrically connected to the data wiring in the peripheral area.

The vertical connection wiring and the data wiring may be integral with each other.

The horizontal connection wiring may be electrically connected to the vertical connection wiring in the display area.

The vertical connection wiring may be electrically connected to the horizontal connection wiring via a contact hole, and the second connecting electrode layer may include an auxiliary horizontal connection wiring that is spaced apart from the horizontal connection wiring to be electrically disconnected from the horizontal connection wiring and the data wiring and that extends parallel to the horizontal connection wiring.

The vertical connection wiring may be electrically connected to the horizontal connection wiring via a contact hole, and the third connecting electrode layer may include an auxiliary vertical connection wiring that is spaced apart from the vertical connection wiring to be electrically disconnected from the horizontal connection wiring and the vertical connection wiring and that extends parallel to the vertical connection wiring.

The third connecting electrode layer may include an additional vertical connection wiring that extends in the second direction and may be electrically connected to the horizontal connection wiring in the display area.

The third connecting electrode layer may include an auxiliary additional vertical connection wiring that is spaced apart from the additional vertical connection wiring to be electrically disconnected from the horizontal connection wiring and the additional vertical connection wiring and that extends parallel to the additional vertical connection wiring.

The third connecting electrode layer may include a data wiring extending in the second direction, the substrate may include a display area, and a peripheral area adjacent to the display area, and the horizontal connection wiring may be electrically connected to the data wiring in the display area.

The data wiring may be electrically connected to the horizontal connection wiring via a contact hole.

The second connecting electrode layer may include an auxiliary horizontal connection wiring that is spaced apart from the horizontal connection wiring to be electrically disconnected from the horizontal connection wiring and the data wiring and that extends parallel to the horizontal connection wiring.

The vertical connection wiring may be electrically disconnected from the data line and the horizontal connection wiring.

The vertical connection wiring may intersect the horizontal connection wiring.

The third connecting electrode layer may include an additional vertical connection wiring that extends in the second direction and is electrically connected to the horizontal connection wiring in the display area.

The third connecting electrode layer may include an auxiliary additional vertical connection wiring that is spaced apart from the additional vertical connection wiring to be electrically disconnected from the horizontal connection wiring and the additional vertical connection wiring and that extends parallel to the additional vertical connection wiring.

According to an embodiment, a display apparatus may include an organic light-emitting diode, a driving transistor that controls an amount of electric current flowing from a first node to the organic light-emitting diode in response to a voltage applied to a second node, the first node being electrically connected to a driving voltage line, a switching transistor that transfers a data signal from a data line to the first node, in response to a voltage applied to a scan line, an initialization transistor that applies an initialization voltage from an initialization voltage line to the second node, in response to a voltage applied to a previous scan line, the initialization transistor including an initialization semiconductor layer disposed on an insulating layer that overlaps a driving semiconductor layer included in the driving transistor, a transfer wiring disposed on an insulating layer that overlaps an initialization gate electrode included in the initialization transistor, the transfer line electrically connecting the initialization semiconductor layer to a driving gate electrode included in the driving transistor, a horizontal connection wiring disposed on an insulating layer that overlaps the transfer wiring and extending in a first direction, and a vertical connection wiring disposed on an insulating layer that overlaps the horizontal connection wiring and extending in a second direction intersecting the first direction.

The vertical connection wiring may be electrically connected to the horizontal connection wiring via a contact hole formed in the insulating layer that overlaps the horizontal connection wiring.

The driving semiconductor layer may include polysilicon and the initialization semiconductor layer includes an oxide semiconductor.

The data line and the vertical connection wiring may be disposed on a same layer.

The data line may extend in the second direction.

The driving voltage line and the vertical connection wiring may be disposed on a same layer.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
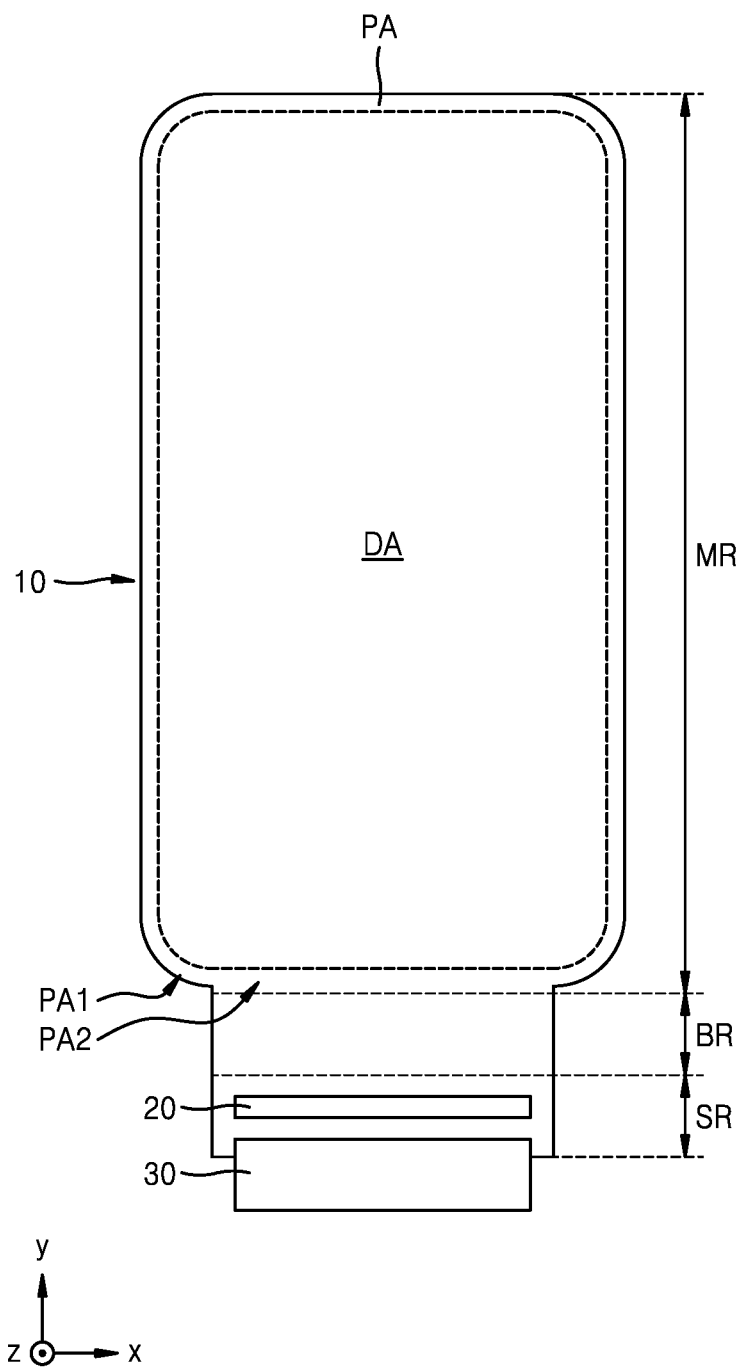
FIG. 1 is a schematic plan view illustrating a region of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations may be omitted.

It will be understood that when an element such as a layer, film, region or substrate is referred to as being placed "on" another element, it can be directly placed on the other element, or an intervening layer(s) may also be present. Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that the terms "contact," "connected to," and "coupled to" may include a physical and/or electrical contact, connection, or coupling.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
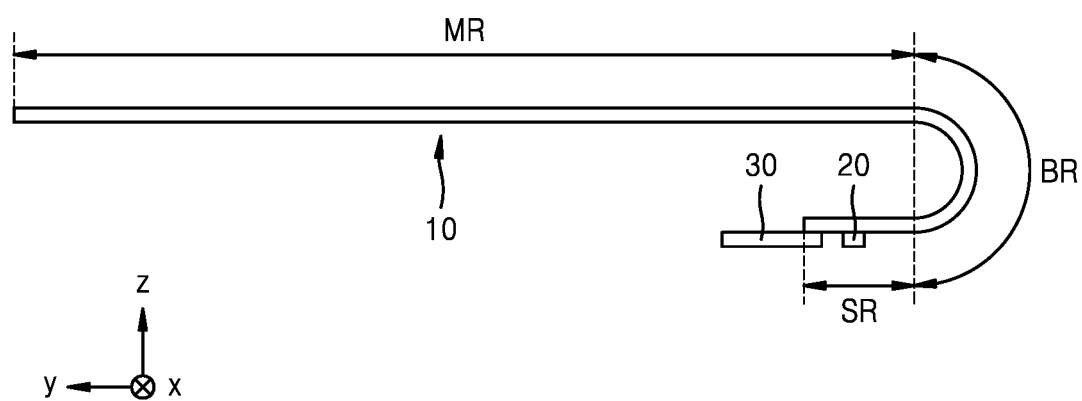
FIG. 2 is a schematic side view of the display apparatus of FIG. 1.

FIG. 1 is a schematic plan view illustrating a portion of a display apparatus according to an embodiment, and FIG. 2 is a schematic side view of the display apparatus of FIG. 1. The display apparatus is partially bent as shown in FIG. 2, but is shown as not being bent in FIG. 1 for convenience of description.

As shown in FIGS. 1 and 2, the display apparatus includes a display panel 10. Any type of display apparatus may be used, provided that the display apparatus includes the display panel 10. For example, the display apparatus may denote various products such as a smartphone, a tablet computer, a laptop computer, a television, a billboard, etc.

The display panel 10 includes a display area DA and a peripheral area PA around or adjacent to the display area DA. The display area DA displays images and may include pixels provided therein. When seen in a direction perpendicular to the display panel 10, the display area DA may have various shapes, e.g., a circular shape, an elliptical shape, a polygonal shape, a certain figure shape, etc. As illustrated in FIG. 1, the display area DA has a rectangular shape having round corners.

The peripheral area PA may be disposed at the outside of the display area DA. The peripheral area PA may include a first peripheral area PA1 that at least partially surrounds a corner portion (in a −y direction and a −x direction) of the display area DA, and a second peripheral area PA2 on a side (in a −y direction) of the outside of the display area DA. The second peripheral area PA2 may be adjacent to the first peripheral area PA1. For example, the second peripheral area PA2 may be disposed more adjacent to a relatively central direction of the display panel 10 than the first peripheral area PA1. A width of the second peripheral area PA2 (in an x-axis direction) may be less than that of the display area DA (in an x-axis direction). With the above structure, at least a part of the second peripheral area PA2 may be readily bent, as described below.

Because the display panel 10 includes a substrate 100 (see FIG. 3), it may be appreciated that the substrate 100 includes the display area DA and the peripheral area PA. Hereinafter, it will be described that the substrate 100 includes the display area DA and the peripheral area PA for convenience of description.

The display panel 10 may also include a main region MR, a bending region BR on an outer portion of the main region MR, and a sub-region SR opposite to the main region MR based on the bending region BR. As shown in FIG. 2, the display panel 10 is bent in the bending region BR, and thus, the sub-region SR may at least partially overlap the main region MR when the display apparatus is seen from a z-axis direction. One or more embodiments are not limited to a bendable display apparatus, but may be also applied to a display apparatus that is not bendable. The sub-region SR may be a non-display area, as described below. Because the display panel 10 is bent in the bending region BR, the non-display area is not visible or may be visible such that a visible area of the non-display area is reduced when the display apparatus is seen from the front (in a −z direction).

A driving chip 20 may be disposed in the sub-region SR of the display panel 10. The driving chip 20 may include an integrated circuit for driving the display panel 10. The integrated circuit may be a data driving integrated circuit for generating a data signal, but one or more embodiments are not limited thereto.

The driving chip 20 may be mounted in the sub-region SR of the display panel 10. Although the driving chip 20 is mounted on the substantially same surface as a display surface of the display area DA, the driving chip 20 may be on a rear surface of the main region MR in case that the display panel 10 is bent in the bending region BR as described above.

A printed circuit board 30 may be attached to an end portion of the sub-region SR of the display panel 10. The printed circuit board 30 may be electrically connected to the driving chip 20, etc., via a pad (not shown) on the substrate 100.

Hereinafter, a display apparatus according to an embodiment is described as an organic light-emitting display apparatus as an example, but the display apparatus is not limited thereto. In an embodiment, the display apparatus may include an inorganic light-emitting display apparatus, an inorganic electroluminescence (EL) display apparatus, or a quantum dot light-emitting display apparatus. For example, the emission layer of a display element included in the display apparatus may include an organic material or an inorganic material. The display apparatus may include an emission layer and quantum dots on a path of light emitted from the emission layer.

Figure 3:
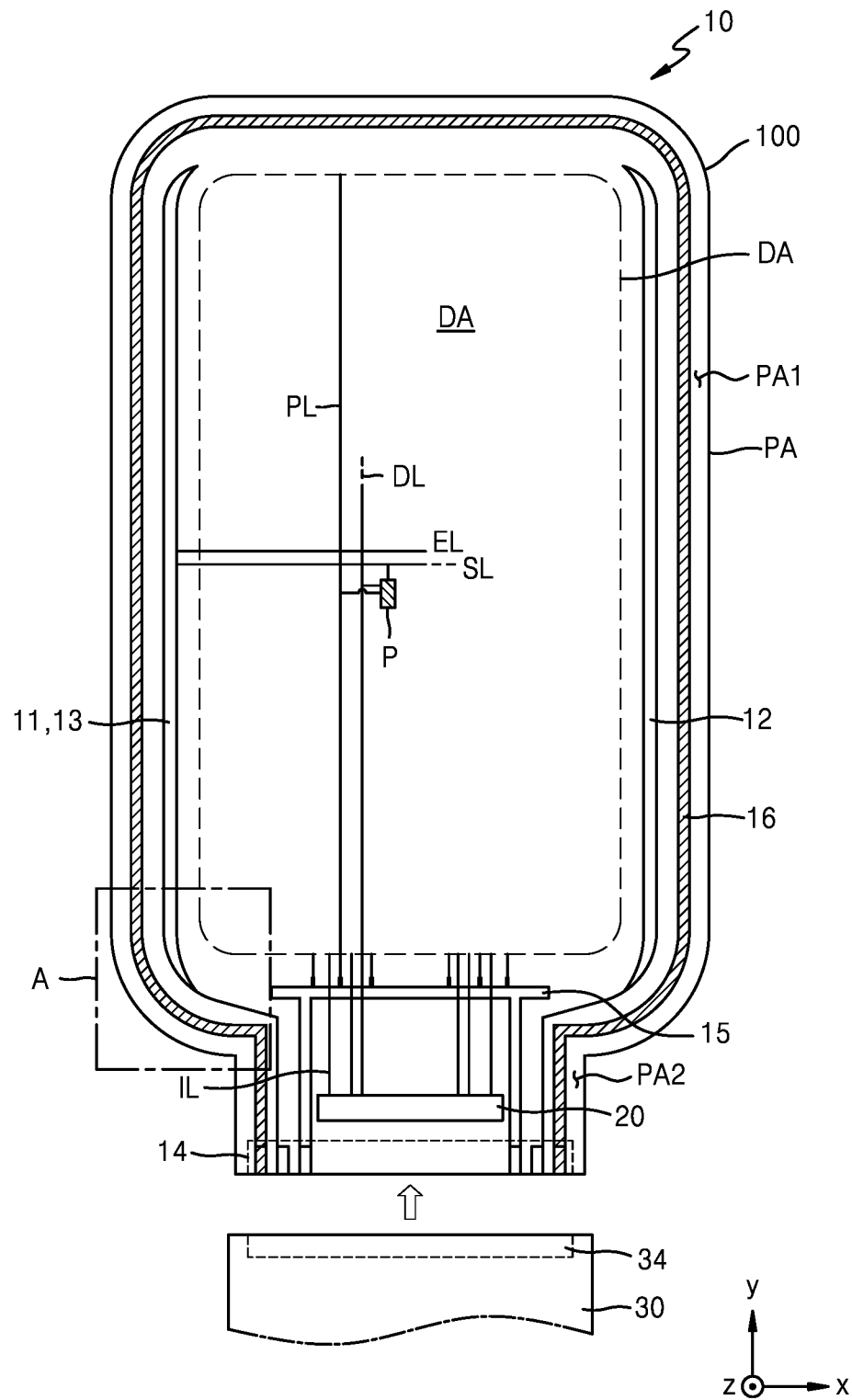
FIG. 3 is a schematic plan view illustrating a region of the display apparatus of FIG. 1.

FIG. 3 is a schematic plan view illustrating a portion of the display panel 10 included in the display apparatus of FIG. 1.

The display panel 10 includes the substrate 100. Various elements included in the display panel 10 may be disposed on the substrate 100. The substrate 100 may include glass, metal, or a polymer resin. In case that the display panel 10 is bent in the bending region BR as described above, the substrate 100 needs to be flexible or bendable. In this case, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified, and for example, the substrate 100 may have a multi-layered structure including two layers each having a polymer resin and a barrier layer disposed between the two layers and including an inorganic material such as silicon oxide, silicon nitride, or silicon oxynitride Pixels P are in the display area DA. Each of the pixels P denotes a sub-pixel and may include a display element such as an organic light-emitting diode OLED. Each of the pixels P may emit, for example, red light, green light, blue light, or white light.

Each of the pixels P may be electrically connected to external circuits in the peripheral area PA. A first scan driving circuit 11, a second scan driving circuit 12, an emission control driving circuit 13, a terminal 14, a first power supply wiring 15, and a second power supply wiring 16 may be disposed in the peripheral area PA.

The first scan driving circuit 11 may provide each pixel P with a scan signal via a scan line SL. The second scan driving circuit 12 may be arranged substantially parallel to the first scan driving circuit 11 with the display area DA therebetween. Some of the pixels P in the display area DA may be electrically connected to the first scan driving circuit 11, and the other pixels P may be electrically connected to the second scan driving circuit 12. The second scan driving circuit 12 may be omitted as necessary, and the pixels P in the display area DA may be electrically connected to the first scan driving circuit 11.

The emission control driving circuit 13 is at a side of the first scan driving circuit 11 and may provide the pixel P with an emission control signal via an emission control line EL. As illustrated in FIG. 3, the emission control driving circuit 13 is at a side of the display area DA, but the emission control driving circuit 13 may be disposed at opposite sides of the display area DA, similar to the first and second scan driving circuits 11 and 12.

The terminal 14 may be disposed in the second peripheral area PA2 of the substrate 100. The terminal 14 may not be covered by an insulating layer, but is exposed and may be electrically connected to a printed circuit board 30. A terminal 34 of the printed circuit board 30 may be electrically connected to a terminal 14 of the display panel 10.

The printed circuit board 30 is configured to transfer a signal or power from a controller (not shown) to the display panel 10. A control signal generated by the controller may be respectively transferred to the first scan driving circuit 11, the second scan driving circuit 12, and the emission control driving circuit 13 via the printed circuit board 30. Also, the controller may transfer a first power voltage ELVDD (see FIG. 4) to the first power supply wiring 15 and may provide the second power supply wiring 16 with a second power voltage ELVSS (see FIG. 4). The first power voltage (or driving voltage) ELVDD is provided to each of pixels P via a power voltage line PL that is connected to the first power supply wiring 15, and the second power voltage ELVSS (or a common voltage) may be provided to an opposite electrode of the pixel P electrically connected to the second power supply wiring 16. The first power supply wiring 15 may extend in a direction (e.g., x-direction) under the second area DA2. The second power supply wiring 16 has a loop shape having an open side and may partially surround the display area DA.

The controller generates a data signal, and the generated data signal is transferred to an input line IL via the driving chip 20 and may be transferred to the pixel P via a data line DL electrically connected to the input line IL.

For reference, "line" may denote "wiring." This will be also applied to embodiments and modifications thereof that will be described below.

Figure 4:
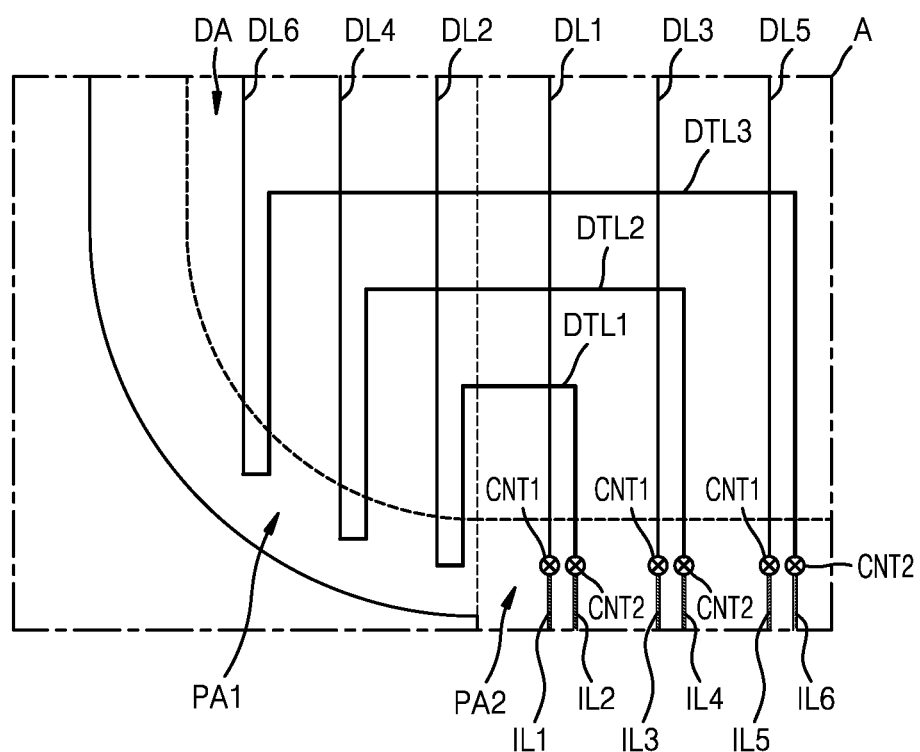
FIGS. 4 and 5 are schematic plan views illustrating an enlarged view of a portion A in the display apparatus of FIG. 3.
Figure 5:
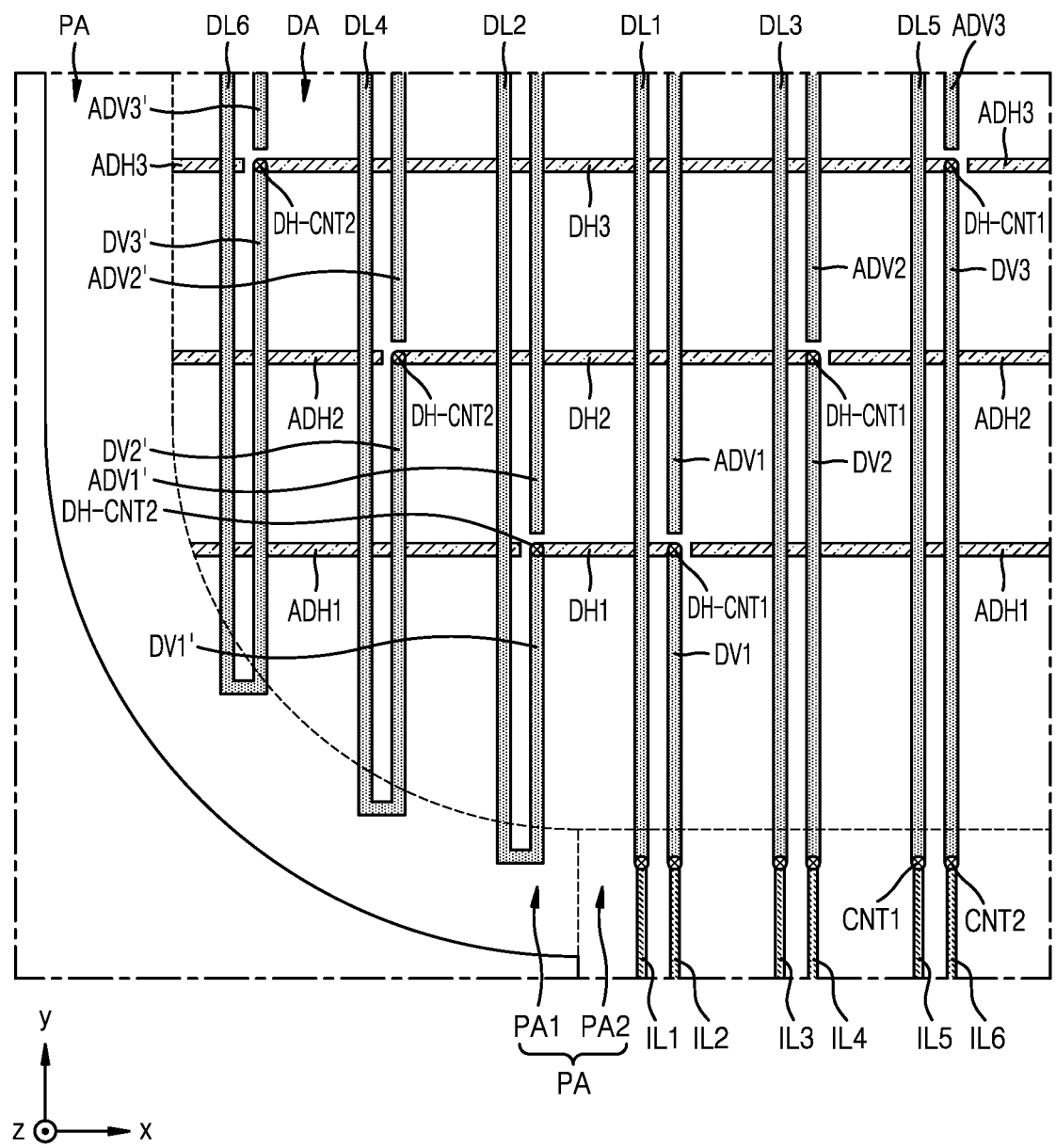

FIGS. 4 and 5 are schematic plan views illustrating an enlarged view of a portion A in the display apparatus of FIG. 3.

Various signals may be applied to the display area DA. For example, a data signal for adjusting brightness in each pixel may be applied to the display area DA. To achieve this, as shown in FIG. 4, data lines DL1 to DL6 that are provided in a first direction (e.g., x-axis direction) to be substantially parallel to one another and extend in a second direction (e.g., y-axis direction) intersecting the first direction may be disposed in the display area DA. If necessary, the data lines DL1 to DL6 may extend from the peripheral area PA into the display area DA as shown in FIG. 4. In addition to the data lines DL1 to DL6, various lines such as a power wiring (not shown) and a scan line (not shown) may be disposed in the display area DA.

First to sixth input lines IL1 to IL6 may be disposed in the peripheral area PA, in particular, the second peripheral area PA2. The first to sixth input lines IL1 to IL6 may be connected to the driving chip 20 to receive input of data signals. The first to sixth data lines DL1 to DL6 are electrically connected to the first to sixth input lines IL1 to IL6 and configured to transfer the data signals to the pixels in the display area DA.

FIGS. 4 and 5 illustrate six input lines and six data lines for convenience of description. However, one or more embodiments are not limited thereto. For example, the number of input lines and the number of data lines may be greater than six.

The first to sixth input lines IL1 to IL6 may be sequentially provided from an edge of the second peripheral area PA2 (in a direction to the first peripheral area PA1) toward a center of the second peripheral area PA2 (in a +x direction).

In an embodiment, odd-numbered input lines, e.g., the first, third, and fifth input lines IL1, IL3, and IL5 may be electrically connected to the first, third, and fifth data lines DL1, DL3, and DL5 that are successively arranged and adjacent to one another, respectively. Each of the first, third, and fifth input lines IL1, IL3, and IL5 may be integrally formed as a single body (or integral) along with a corresponding one of first, third, and fifth data lines DL1, DL3, and DL5, and as shown in FIGS. 4 and 5, each of the first, third, and fifth input lines IL1, IL3, and IL5 may be electrically connected to a corresponding one of the first, third, and fifth data lines DL1, DL3, and DL5 via first contact holes CNT1. In the latter case, as shown in FIG. 5, the first, third, and fifth data lines DL1, DL3, and DL5 may be disposed on an insulating layer that covers the first, third, and fifth input lines IL1, IL3, and IL5. The first, third, and fifth data lines DL1, DL3, and DL5 may receive data signal inputs from the first, third, and fifth input lines IL1, IL3, and IL5, respectively.

Even-numbered input lines, e.g., second, fourth, and sixth input lines IL2, IL4, and IL6 may be electrically connected to second, fourth, and sixth data lines DL2, DL4, and DL6 that are adjacent to one another and successively arranged, via first to third data transfer lines DTL1 to DTL3 as shown in FIG. 4. For example, the second, fourth, and sixth data lines DL2, DL4, and DL6 may receive data signal inputs from the second, fourth, and sixth input lines IL2, IL4, and IL6, respectively, via the first to third data transfer lines DTL1, DTL2, and DTL3.

The first to third data transfer lines DTL1 to DTL3 may be provided to pass by a part of the display area DA, which is adjacent to the peripheral area PA, for example, to go through the display area DA. The second input line IL2 is electrically connected to the second data line DL2 via the first data transfer line DTL1, the fourth input line IL4 is electrically connected to the fourth data line DL4 via the second data transfer line DTL2, and the sixth input line IL6 is electrically connected to the sixth data line DL6 via the third data transfer line DTL3.

End portions of the first data transfer line DTL1, the second data transfer line DTL2, and the third data transfer line DTL3 are electrically connected to the second input line IL2, the fourth input line IL4, and the sixth input line IL6 respectively via the second contact hole CNT2, and the other ends of the first data transfer line DTL1, the second data transfer line DTL2, and the third data transfer line DTL3 may be electrically connected to the second data line DL2, the fourth data line DL4, and the sixth data line DL6. As illustrated in FIGS. 4 and 5, the second contact hole CNT2 is in the peripheral area PA, but one or more embodiments are not limited thereto. For example, the second contact hole CNT2 may be disposed in the display area DA.

With the above structure, the second input line IL2 is configured to transfer the data signal to the second data line DL2, the fourth input line IL4 is configured to transfer the data signal to the fourth data line DL4, and the sixth input line IL6 may be configured to transfer the data signal to the sixth data line DL6.

FIG. 5 illustrates an example structure of the first data transfer line DTL1, the second data transfer line DTL2, and the third data transfer line DTL3 of FIG. 4.

As shown in FIG. 5, the second, fourth, and sixth input lines IL2, IL4, and IL6 may be electrically connected to the second, fourth, and sixth data lines DL2, DL4, and DL6, respectively, via the first data transfer line DTL1, the second data transfer line DTL2, and the third data transfer line DTL3. Here, the first data transfer line DTL1 may include a first vertical connection line DV1', a first horizontal connection line DH1, and a first additional vertical connection line DV1. Similarly, the second data transfer line DTL2 may include a second vertical connection line DV2', a second horizontal connection line DH2, and a second additional vertical connection line DV2. The third data transfer line DTL3 may include a third vertical connection line DV3', a third horizontal connection line DH3, and a third additional vertical connection line DV3.

The first vertical connection line DV1' to the third vertical connection line DV3' and the first additional vertical connection line DV1 to the third additional vertical connection line DV3 may be provided substantially parallel to the first to sixth data lines DL1 to DL6. The first horizontal connection line DH1 to the third horizontal connection line DH3 may extend in the first direction (e.g., x-axis direction) intersecting the second direction (e.g., y-axis direction) in which the first to third data lines DL1 to DL6 extend.

Each of the second input line IL2, the fourth input line IL4, and the sixth input line IL6 may be electrically connected to a corresponding one of the first additional vertical connection line DV1, the second additional vertical connection line DV2, and the third additional vertical connection line DV3 via the second contact holes CNT2. Each of the first horizontal connection line DH1, the second horizontal connection line DH2, and the third horizontal connection line DH3 may be electrically connected to a corresponding one of the first additional vertical connection line DV1, the second additional vertical connection line DV2, and the third additional vertical connection line DV3 via a first connecting contact hole DH-CNT1 at one end thereof. Each of the first horizontal connection line DH1, the second horizontal connection line DH2, and the third horizontal connection line DH3 may be electrically connected to a corresponding one of the first vertical connection line DV1', the second vertical connection line DV2', and the third vertical connection line DV3' via a second connecting contact hole DH-CNT2 at an opposite end thereof. Each of the first vertical connection line DV1', the second vertical connection line DV2', and the third vertical connection line DV3' may be integral with a corresponding one of the second data line DL2, the fourth data line DL4, and the sixth data line DL6.

The first to sixth data lines DL1 to DL6, the first to third vertical connection lines DV1' to DV3', and the first to third additional vertical connection lines DV1 to DV3 may be disposed on the same layer. The first to third horizontal connection lines DH1 to DH3 and the first to sixth data lines DL1 to DL6 may be disposed on different layers. As illustrated in FIG. 5, the first to sixth data lines DL1 to DL6 are disposed on the insulating layer that covers (or overlaps) the first to third horizontal connection lines DH1 to DH3. In case that some components are on the same layer, it denotes that the components are simultaneously manufactured by using the same material by the same mask process. In this case, the components include the same material.

When seen in the direction perpendicular to the substrate 100 (or z-axis direction), the first horizontal connection line DH1 intersects the first data line DL1, the second horizontal connection line DH2 intersects the first to third data lines DL1 to DL3, and the third horizontal connection line DH3 intersects the first to fifth data lines DL1 to DL5. Therefore, in order for the first to third horizontal connection lines DH1 to DH3 not to contact the intersecting data lines, as described above, the first to third horizontal connection lines DH1 to DH3 may be under the first to sixth data lines DL1 to DL6.

As shown in FIG. 5, the display apparatus may further include dummy wirings.

As shown in FIG. 5, the display apparatus may include a first auxiliary horizontal connection line ADH1 that is spaced apart from the first horizontal connection line DH1 to be electrically insulated from the first horizontal connection line DH1 and the second data line DL2 and has an extending axis that is substantially identical to that of the first horizontal connection line DH1. In particular, the display apparatus may include the first auxiliary horizontal connection line ADH1 at a side (in a −x direction) of the first horizontal connection line DH1, and the first auxiliary horizontal connection line ADH1 at another side (in a +x direction) of the first horizontal connection line DH1. Likewise, the display apparatus may include a second auxiliary horizontal connection line ADH2 at a side (in the −x direction) of the second horizontal connection line DH2 and a second auxiliary horizontal connection line ADH2 at another side (in the +x direction) of the second horizontal connection line DH2, and a third auxiliary horizontal connection line ADH3 at a side (in the −x direction) of the third horizontal connection line DH3 and a third auxiliary horizontal connection line ADH3 at another side (in the +x direction) of the third horizontal connection line DH3.

Therefore, a structural difference between the pixels through which the first to third horizontal connection lines DH1 to DH3 pass and the pixels through which the first to third horizontal connection lines DH1 to DH3 do not pass may be reduced. In consequence, a variation in luminance realized by the pixels in case that the same electrical signal is applied to the pixels may be reduced, and the display apparatus capable of displaying high quality images may be implemented. The first to third auxiliary horizontal connection line ADH1 to ADH3 and the first to third horizontal connection lines DH1 to DH3 may be disposed on the same layer.

Similarly, the display apparatus may include a first auxiliary vertical connection line ADV1' that is spaced apart from the first vertical connection line DV1' to be electrically insulated from the first vertical connection line DV1' and the first horizontal connection line DH1, and that has the same extending axis as that of the first vertical connection line DV1' to be at a side (in a +y direction) of the first vertical connection line DV1'. Likewise, the display apparatus may include a second auxiliary vertical connection line ADV2' at a side (in the +y direction) of the second vertical connection line DV2', and a third auxiliary vertical connection line ADV3' at a side (in the +y direction) of the third vertical connection line DV3'. The first to third auxiliary vertical connection lines ADV1' to ADV3' and the first to third vertical connection lines DV1' to DV3' may be disposed on the same layer.

The display apparatus may include a first additional auxiliary vertical connection line ADV1 that is spaced apart from the first additional vertical connection line DV1 to be electrically insulated from the first additional vertical connection line DV1 and the first horizontal connection line DH1, and that has the same extending axis as that of the first additional vertical connection line DV1 to be at a side (in the +y direction) of the first additional vertical connection line DV1. Likewise, the display apparatus may include a second additional auxiliary vertical connection line ADV2 at a side (in the +y direction) of the second additional vertical connection line DV2, and a third additional auxiliary vertical connection line ADV3 at a side (in the +y direction) of the third additional vertical connection line DV3. The first to third additional auxiliary vertical connection lines ADV1 to ADV3 and the first to third additional vertical connection lines DV1 to DV3 may be disposed on the same layer.

As such, a structural difference between the pixels through which the first to third vertical connection line DV1' to DV3' pass and the pixels through which the first to third vertical connection line DV1' to DV3' do not pass may be reduced. A structural difference between the pixels through which the first to third additional vertical connection line DV1 to DV3 pass and the pixels through which the first to third additional vertical connection line DV1 to DV3 do not pass may be reduced. Thus, a variation in luminance realized by the pixels in case that the same electrical signal is applied to the pixels may be reduced, and thus, the display apparatus capable of displaying high quality images may be implemented.

Figure 6:
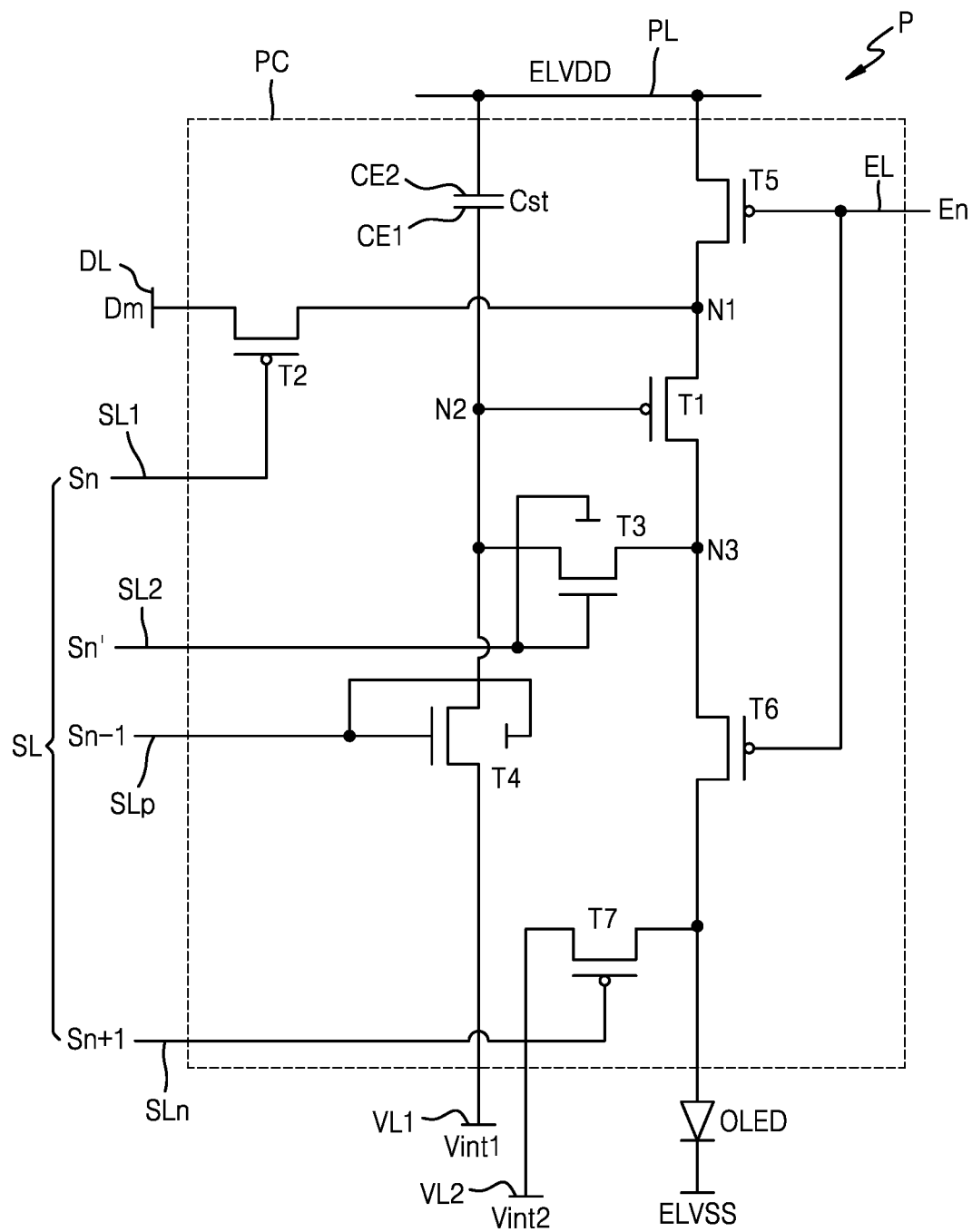
FIG. 6 is an equivalent circuit diagram of a pixel included in the display apparatus of FIG. 1.

FIG. 6 is an equivalent circuit diagram of a pixel P included in the display apparatus of FIG. 1. As shown in FIG. 6, the pixel P includes a pixel circuit PC and an organic light-emitting diode OLED electrically connected to the pixel circuit PC.

The pixel circuit PC, as shown in FIG. 6, may include thin-film transistors T1 to T7 and a storage capacitor Cst. The thin-film transistors T1 to T7 and the storage capacitor Cst may be electrically connected to signal lines SL1, SL2, SLp, SLn, EL, and DL, a first initialization voltage line VL1, a second initialization voltage line VL2, and a driving voltage line PL. At least one of the lines, e.g., the driving voltage line PL, may be shared by neighboring pixels P.

The thin-film transistors T1 to T7 may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a first electrode (e.g., a pixel electrode) and a second electrode (e.g., an opposite electrode), and the first electrode of the organic light-emitting diode OLED is electrically connected to the driving transistor T1 by the emission control transistor T6 to receive a driving current, and the second electrode may receive a second power voltage ELVSS. The organic light-emitting diode OLED may generate light of a luminance corresponding to the driving current.

Some of the thin-film transistors T1 to T7 may be n-channel MOSFET (NMOS) and the others may be p-channel MOSFET (PMOS). For example, among the thin-film transistors T1 to T7, the compensation transistor T3 and the first initialization transistor T4 may be NMOS transistors and the others may be PMOS transistors. As another example, among the thin-film transistors T1 to T7, the compensation transistor T3, the first initialization transistor T4, and the second initialization transistor T7 may be NMOS transistors and the others may be PMOS transistors. As another example, the thin-film transistors T1 to T7 may be NMOS or PMOS transistors. The thin-film transistors T1 to T7 may include amorphous silicon or polysilicon. As necessary, the thin-film transistor that is an NMOS transistor may include oxide semiconductor. Hereinafter, a case in which the compensation transistor T3 and the first initialization transistor T4 are the NMOS transistors including oxide semiconductor and the others are PMOS transistors will be described for convenience of description.

The signal lines may include a first scan line SL1 configured to transfer a first scan signal Sn, a second scan line SL2 configured to transfer a second scan signal Sn', a previous scan line SLp configured to transfer a previous scan signal Sn−1 to the first initialization transistor T4, a post scan line SLn configured to transfer a post scan signal Sn+1 to the second initialization transistor T7, the emission control line EL configured to transfer an emission control signal En to the operation control transistor T5 and the emission control transistor T6, and the data line DL configured to transfer a data signal Dm and intersecting the first scan line SL1.

The driving voltage line PL is configured to transfer the driving voltage ELVDD to the driving transistor T1, the first initialization voltage line VL1 is configured to transfer a first initialization voltage Vint1 for initializing the driving transistor T1, and the second initialization voltage line VL2 may be configured to transfer a second initialization voltage Vint2 for initializing the first electrode of the organic light-emitting diode OLED.

A driving gate electrode of the driving transistor T1 is electrically connected to the storage capacitor Cst via a second node N2, one of a source region and a drain region of the driving transistor T1 is electrically connected to the driving voltage line PL after passing through the operation control transistor T5 via a first node N1, and the other of the source region and the drain region of the driving transistor T1 may be electrically connected to the first electrode (or pixel electrode) of the organic light-emitting diode OLED after passing through the emission control transistor T6 via a third node N3. The driving transistor T1 receives the data signal Dm according to a switching operation of the switching transistor T2 to supply a driving current to the organic light-emitting diode OLED. For example, the driving transistor T1 may control an amount of current flowing from the first node N1 that is electrically connected to the driving voltage line PL to the organic light-emitting diode OLED, in response to a voltage applied to the second node N2, the voltage varying due to the data signal Dm.

A switching gate electrode of the switching transistor T2 is electrically connected to the first scan line SL1 configured to transfer the first scan signal Sn, one of a source region and a drain region of the switching transistor T2 is electrically connected to the data line DL, and the other of the source region and the drain region of the switching transistor T2 is electrically connected to the driving transistor T1 via the first node N1 and then may be electrically connected to the driving voltage line PL via the operation control transistor T5. The switching transistor T2 may transfer the data signal Dm from the data line DL to the first node N1, in response to the voltage applied to the first scan line SL1. For example, the switching transistor T2 is turned on according to the first scan signal Sn transferred via the first scan line SL1 and may perform a switching operation for transferring the data signal Dm transferred through the data line DL to the driving transistor T1 via the first node N1.

A compensation gate electrode of the compensation transistor T3 is electrically connected to the second scan line SL2. One of a source region and a drain region of the compensation transistor T3 may be electrically connected to the first electrode of the organic light-emitting diode OLED after passing through the emission control transistor T6 via the third node N3. The other of the source region and the drain region of the compensation transistor T3 may be electrically connected to a first capacitor electrode CE1 of the storage capacitor Cst and the driving gate electrode of the driving transistor T1 via the second node N2. The compensation transistor T3 may be turned on according to the second scan signal Sn' transferred via the second scan line SL2 for diode-connecting the driving transistor T1.

A first initialization gate electrode of the first initialization transistor T4 may be electrically connected to the previous scan line SLp. One of a source region and a drain region of the first initialization transistor T4 may be electrically connected to the first initialization voltage line VL1. The other of the source region and the drain region of the first initialization transistor T4 may be electrically connected to the first capacitor electrode CE1 of the storage capacitor Cst and the driving gate electrode of the driving transistor T1 via the second node N2. The first initialization transistor T4 may apply the first initialization voltage Vint1 from the first initialization voltage line VL1 to the second node N2, in response to the voltage applied to the previous scan line SLp. For example, the first initialization transistor T4 is turned on according to the previous scan signal Sn−1 transferred through the previous scan line SLp, and transfers the first initialization voltage Vint1 to the driving gate electrode of the driving transistor T1 and performs an initialization operation for initializing the voltage at the driving gate electrode of the driving transistor T1.

An operation control gate electrode of the operation control transistor T5 is electrically connected to the emission control line EL, and one of the source region and the drain region of the operation control transistor T5 is electrically connected to the driving voltage line PL and the other may be electrically connected to the driving transistor T1 and the switching transistor T2 via the first node N1.

An emission control gate electrode of the emission control transistor T6 is electrically connected to the emission control line EL, and one of a source region and a drain region of the emission control transistor T6 is electrically connected to the driving transistor T1 and the compensation transistor T3 via the third node N3, and the other may be electrically connected to the first electrode (or pixel electrode) of the organic light-emitting diode OLED.

The operation control transistor T5 and the emission control transistor T6 are simultaneously turned on according to an emission control signal En transferred through the emission control line EL to transfer a driving voltage ELVDD to the organic light-emitting diode OLED and to allow the driving current to flow in the organic light-emitting diode OLED.

A second initialization gate electrode of the second initialization transistor T7 is electrically connected to the post scan line SLn, one of a source region and a drain region of the second initialization transistor T7 is electrically connected to the first electrode (or pixel electrode) of the organic light-emitting diode OLED and the other may be electrically connected to the second initialization voltage line VL2 to receive the second initialization voltage Vint2. The second initialization transistor T7 is turned on according to the post scan signal Sn+1 transferred through the post scan line SLn and initializes the first electrode (or pixel electrode) of the organic light-emitting diode OLED. The post scan line SLn may be substantially identical to the first scan line SL1. In this case, the corresponding scan line is configured to transfer the same electrical signal with a time difference, so as to function as the first scan line SL1 or the post scan line SLn. For example, the post scan line SLn may be a first scan line of a pixel that is adjacent to the pixel P shown in FIG. 6 and is electrically connected to the data line DL.

The second initialization transistor T7 may be electrically connected to the first scan line SL1 as shown in FIG. 6. However, one or more embodiments are not limited thereto. For example, the second initialization transistor T7 may be electrically connected to the emission control line EL and may be driven according to the emission control signal En.

The storage capacitor Cst may include the first capacitor electrode CE1 and a second capacitor electrode CE2. The first capacitor electrode CE1 of the storage capacitor Cst is electrically connected to the driving gate electrode of the driving transistor T1 via the second node N2, and the second capacitor electrode CE2 of the storage capacitor Cst is electrically connected to the driving voltage line PL. The storage capacitor Cst may store a charge corresponding to a difference between the driving gate electrode voltage of the driving transistor T1 and the driving voltage ELVDD.

Detailed operations of each pixel P are as follows.

During an initialization period, in case that the previous scan signal Sn−1 is supplied through the previous scan line SLp, the first initialization transistor T4 is turned on in response to the previous scan signal Sn−1, and the driving transistor T1 is initialized by the first initialization voltage Vint1 supplied from the first initialization voltage line VL1.

During a data programming period, in case that the first scan signal Sn and the second scan signal Sn' are supplied through the first scan line SL1 and the second scan line SL2, the switching transistor T2 and the compensation transistor T3 are turned on in response to the first scan signal Sn and the second scan signal Sn'. Here, the driving transistor T1 is diode-connected by the compensation transistor T3 that is turned on, and is biased in a forward direction. Then, a compensation voltage (Dm+Vth, where Vth has a negative value) that is obtained by subtracting a threshold voltage Vth of the driving transistor T1 from the data signal Dm supplied from the data line DL, is applied to the driving gate electrode of the driving transistor T1. The driving voltage ELVDD and the compensation voltage (Dm+Vth) are applied to opposite ends of the storage capacitor Cst, and the storage capacitor Cst stores an electric charge corresponding to a difference between voltages at opposite ends thereof.

During an emission period, the operation control transistor T5 and the emission control transistor T6 are turned on according to the emission control signal En supplied from the emission control line EL. The driving current is generated according to a difference between the voltage of the driving gate electrode of the driving transistor T1 and the driving voltage ELVDD, and the driving current is supplied to the organic light-emitting diode OLED via the emission control transistor T6.

As described above, some of the transistors T1 to T7 may include oxide semiconductor. For example, the compensation transistor T3 and the first initialization transistor T4 may include oxide semiconductor.

Because the polysilicon has high reliability, the exact current as desired may be controlled to flow. Therefore, the driving transistor T1 that directly affects the brightness of the display apparatus includes a semiconductor layer including the polysilicon having high reliability, and thus, the display apparatus of high resolution may be implemented. Oxide semiconductor has a high carrier mobility and a low leakage current, and a voltage drop may not be large even in case that a driving time is increased. For example, because there is a small color change in the image due to the voltage drop even in a low frequency driving, a low frequency driving of the oxide semiconductor is possible. Therefore, the compensation transistor T3 and the first initialization transistor T4 include the oxide semiconductor, and the display apparatus capable of preventing a leakage current and reducing power consumption may be implemented.

Because the oxide semiconductor is sensitive to light, and there may be a variation in a current amount due to the external light. Therefore, a metal layer may be under the oxide semiconductor in order to absorb or reflect the external light. Accordingly, as shown in FIG. 6, the compensation transistor T3 and the first initialization transistor T4 including the oxide semiconductor may each have gate electrodes on and under the oxide semiconductor layer. For example, when seen in the direction perpendicular to the upper surface of the substrate 100 (or z-axis direction), the metal layer under the oxide semiconductor may overlap the oxide semiconductor.

Figure 7:
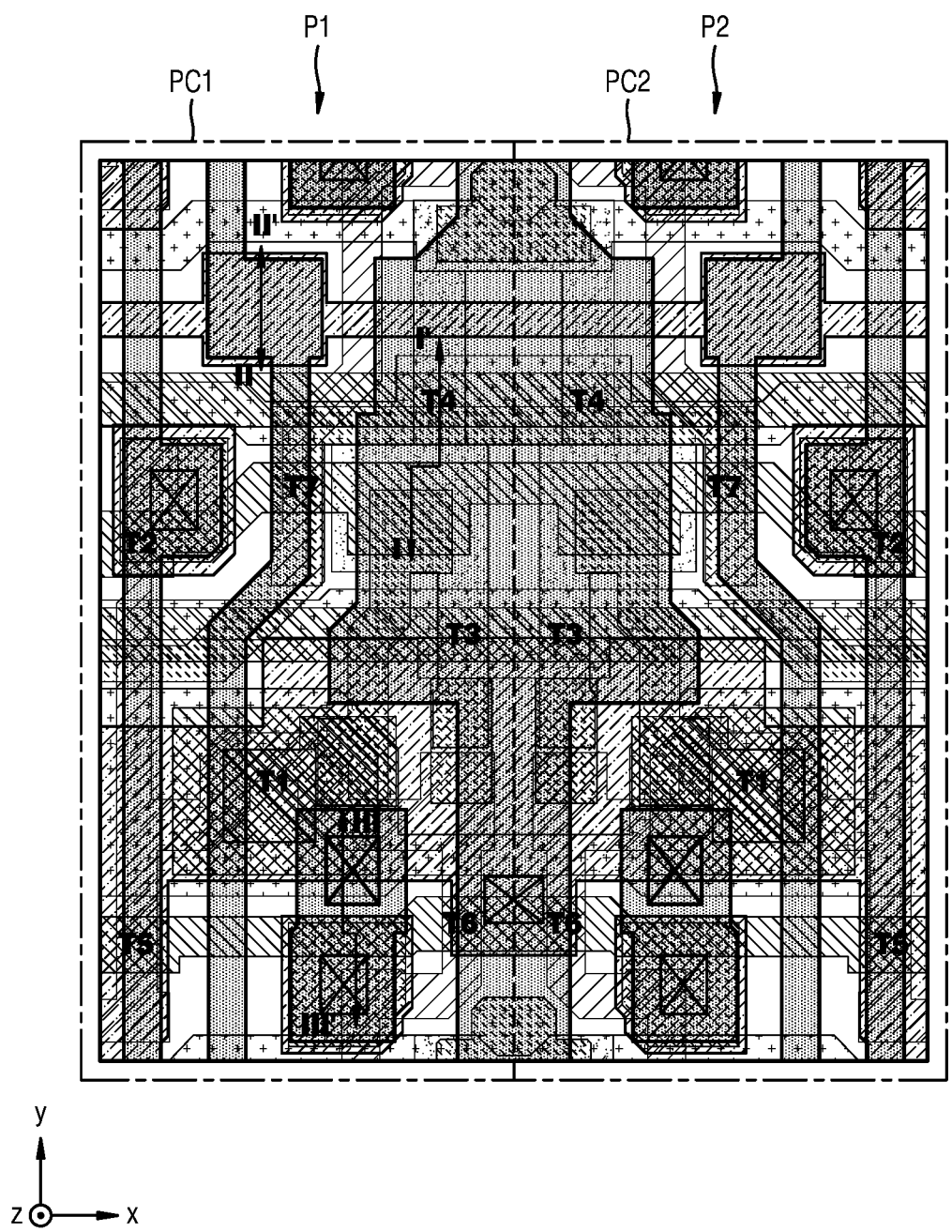
FIG. 7 is a schematic layout illustrating locations of transistors and capacitors in pixels included in the display apparatus of FIG. 1.
Figure 14:
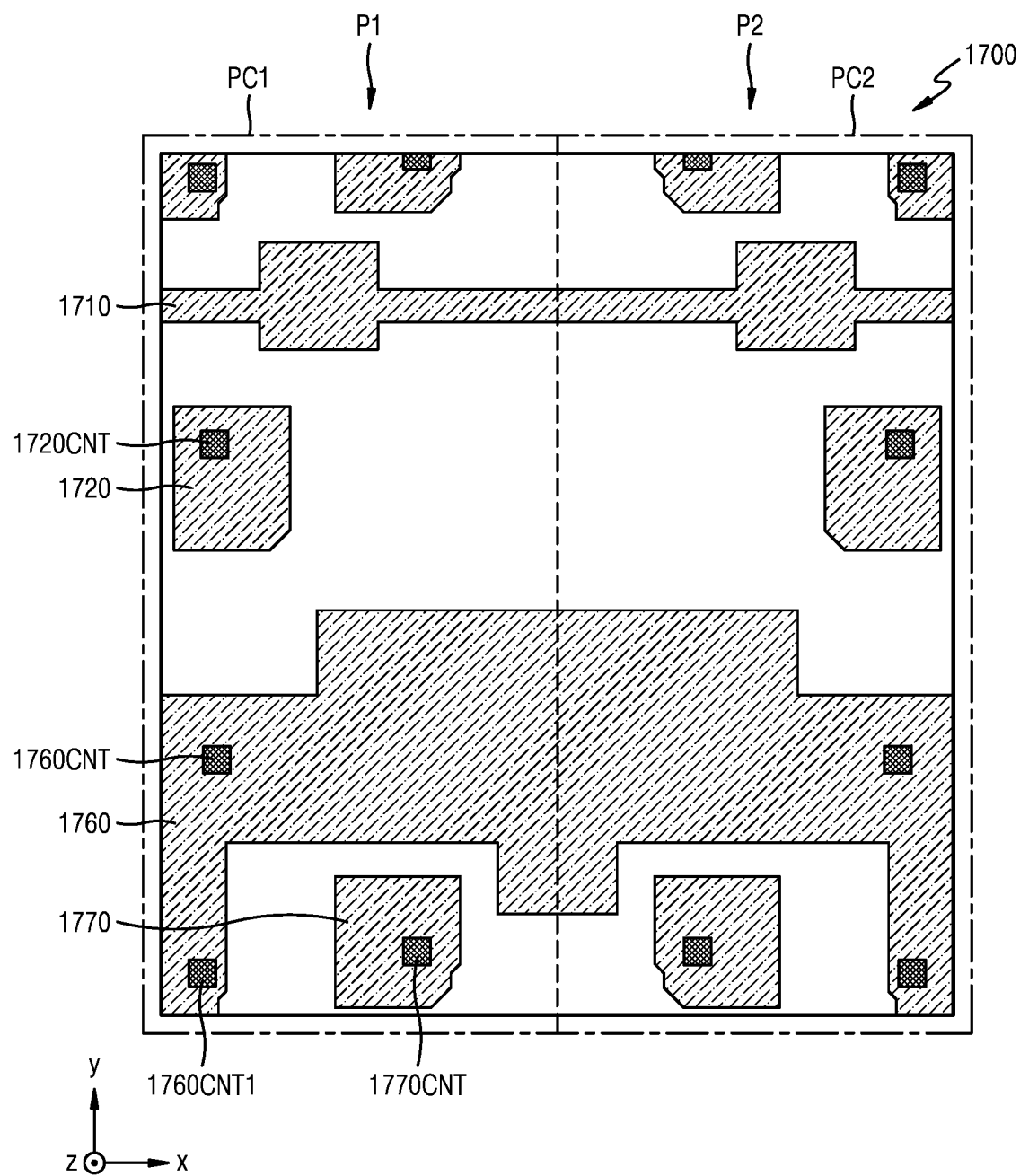
Figure 15:
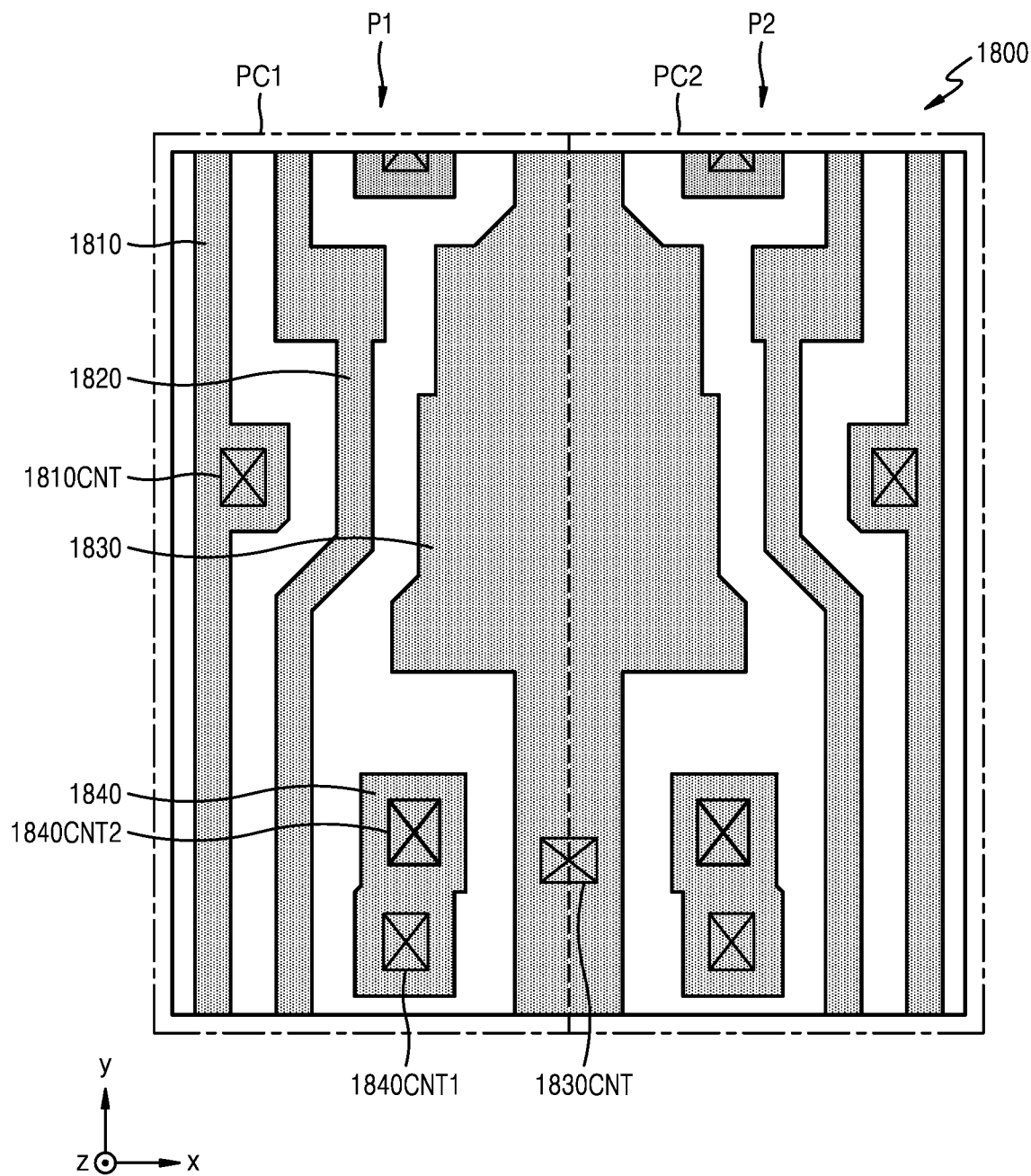
Figure 16:
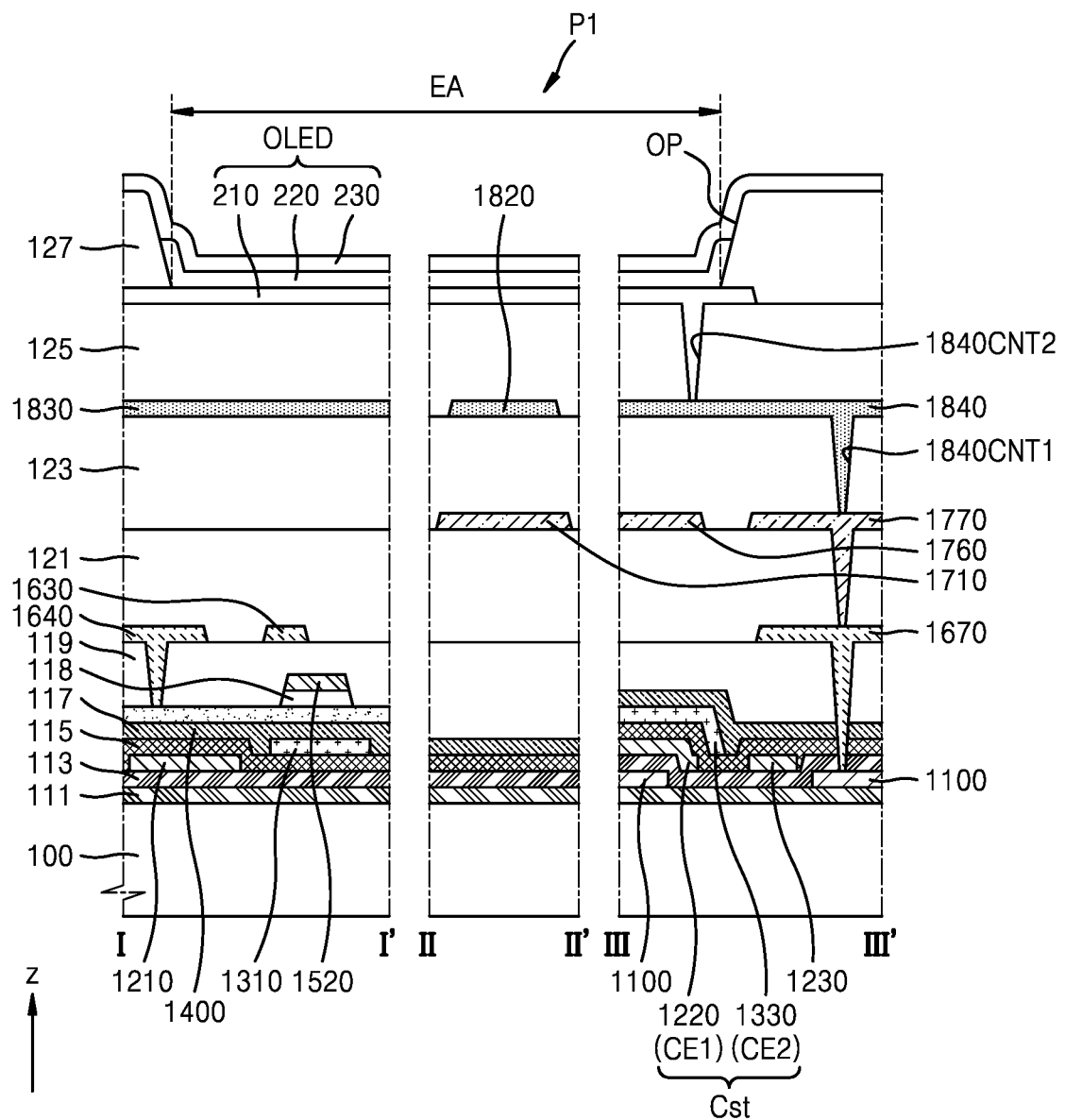
FIG. 16 is a schematic cross-sectional view of the display apparatus of FIG. 7 taken along lines I-I', II-II', and III-III'.

FIG. 7 is a schematic layout illustrating locations of the transistors and capacitors in the pixels included in the display apparatus of FIG. 1, FIGS. 8 to 15 are schematic layouts illustrating components such as transistors, capacitors, etc. in the display apparatus of FIG. 7 for each of the layers, and FIG. 16 is a schematic cross-sectional view of the display apparatus of FIG. 7 taken along lines I-I', and As shown in the drawings, the display apparatus includes a first pixel P1 and a second pixel P2 adjacent to each other. The first pixel P1 and the second pixel P2 may be symmetrical with each other based on a virtual line as shown in FIG. 7, etc. Otherwise, the first pixel P1 and the second pixel P2 may have the same structure, not the symmetrical structure. The first pixel P1 includes a first pixel circuit PC1, and the second pixel P2 includes a second pixel circuit PC2. Hereinafter, some conductive patterns will be described based on the first pixel circuit PC1 for convenience of description, but the conductive patterns may be symmetrically provided in the second pixel circuit PC2.

A buffer layer 111 (see FIG. 16) including silicon oxide, silicon nitride, or silicon oxynitride may be disposed on the substrate 100. The buffer layer 111 may prevent metal atoms or impurities from dispersing from the substrate 100 to a first semiconductor layer 1100 thereon. The buffer layer 111 may adjust a speed of providing heat during a crystallization process for forming the first semiconductor layer 1100, such that the first semiconductor layer 1100 may be evenly crystallized.

Figure 8:
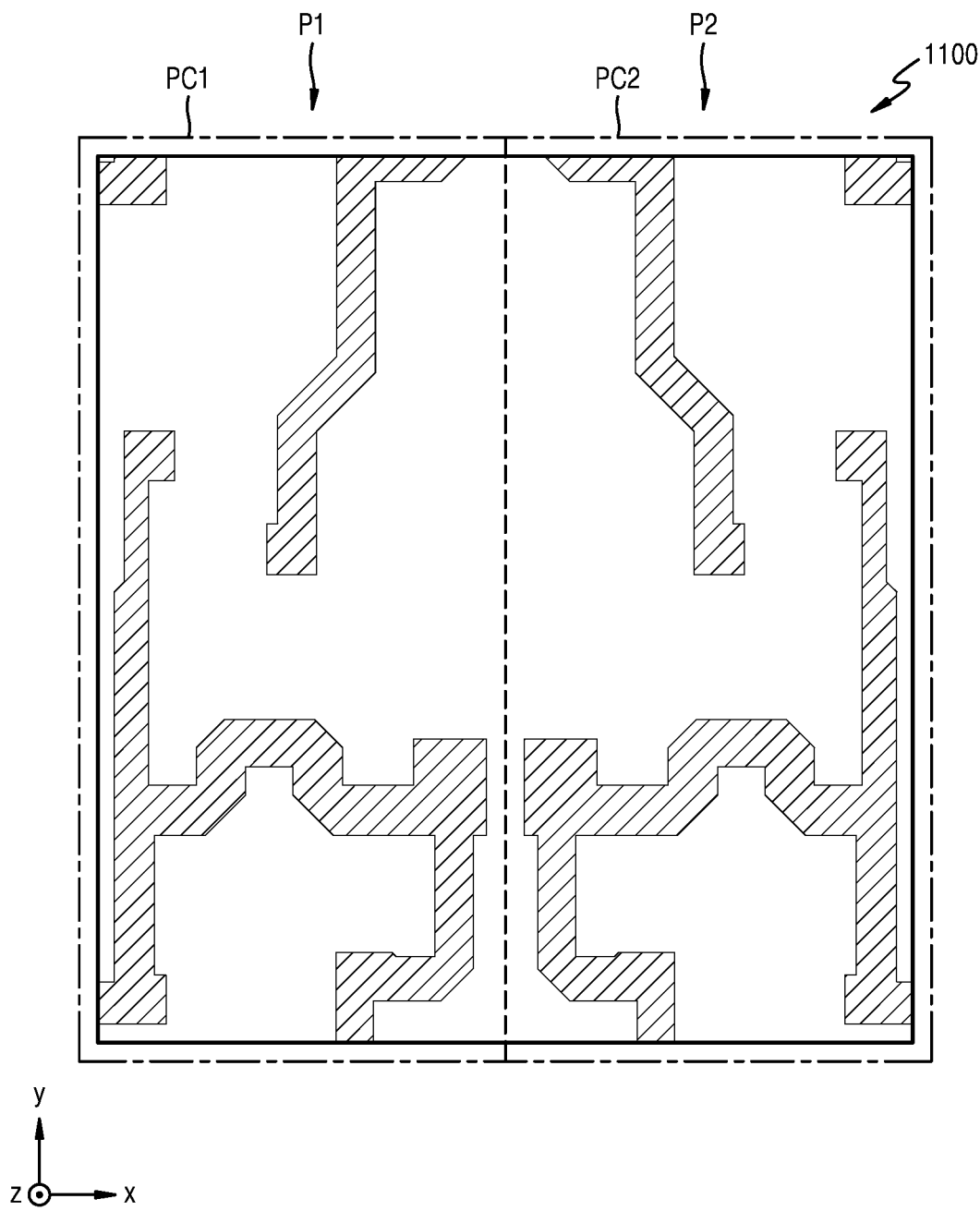
FIGS. 8 to 15 are schematic layouts illustrating elements such as transistors and capacitors for each of layers in the display apparatus of FIG. 7.

The first semiconductor layer 1100 as shown in FIG. 8 may be disposed on the buffer layer 111. The first semiconductor layer 1100 may include silicon semiconductor. For example, the first semiconductor layer 1100 may include amorphous silicon or polysilicon. In detail, the first semiconductor layer 1100 may include polysilicon that is crystallized at a low temperature. If necessary, ions may be implanted into at least a part of the first semiconductor layer 1100.

Because the driving transistor T1, the switching transistor T2, the operation control transistor T5, the emission control transistor T6, and the second initialization transistor T7 may be PMOS transistors as described above, the above thin-film transistors may be provided along the first semiconductor layer 1100 as shown in FIG. 8.

A first gate insulating layer 113 (see FIG. 16) covers (or overlaps) the first semiconductor layer 1100 and may be disposed on the substrate 100. The first gate insulating layer 113 may include an insulating material. For example, the first gate insulating layer 113 may include silicon oxide, silicon nitride, silicon oxynitride, aluminum oxide, etc.

Figure 9:
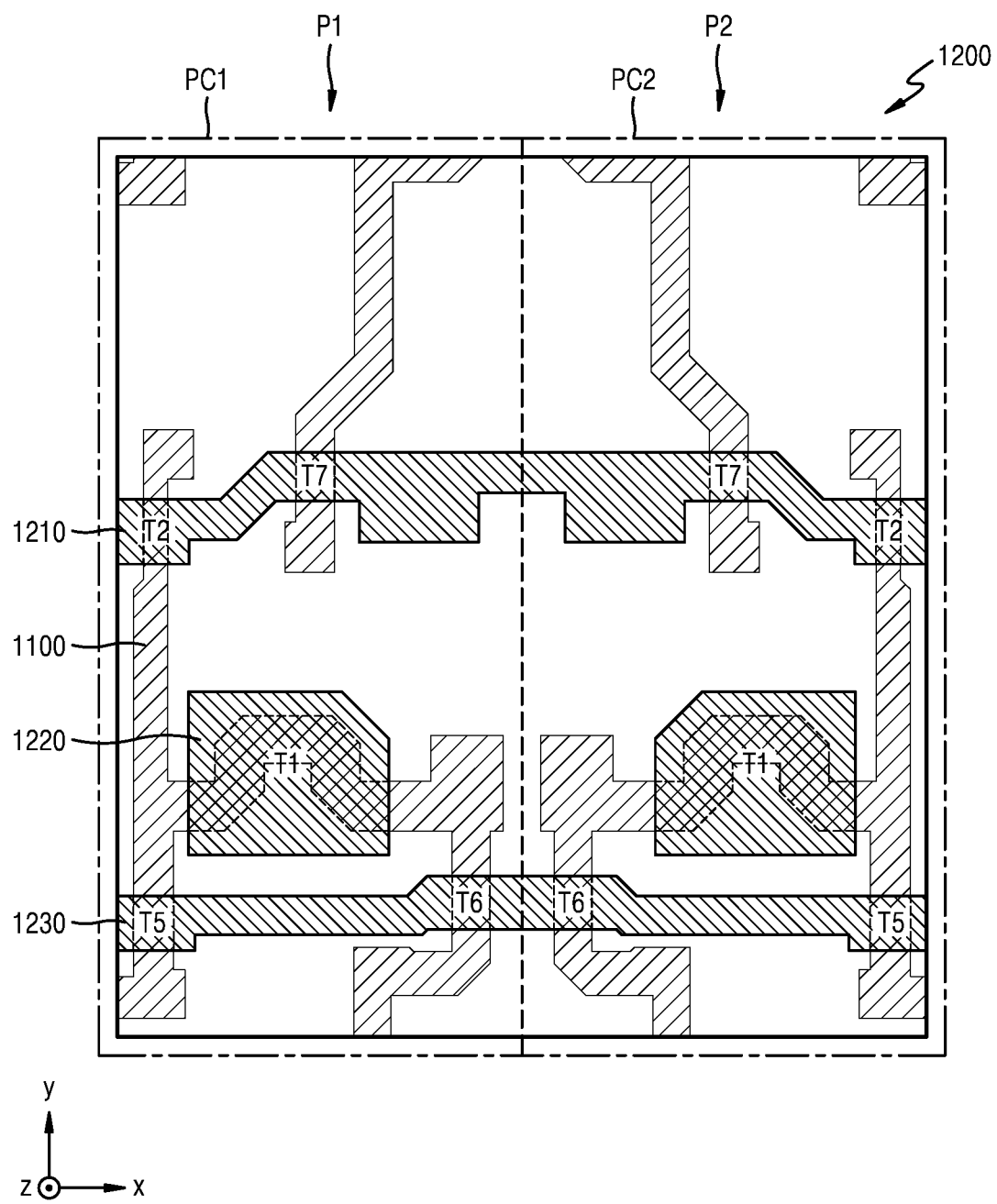
Figure 10:
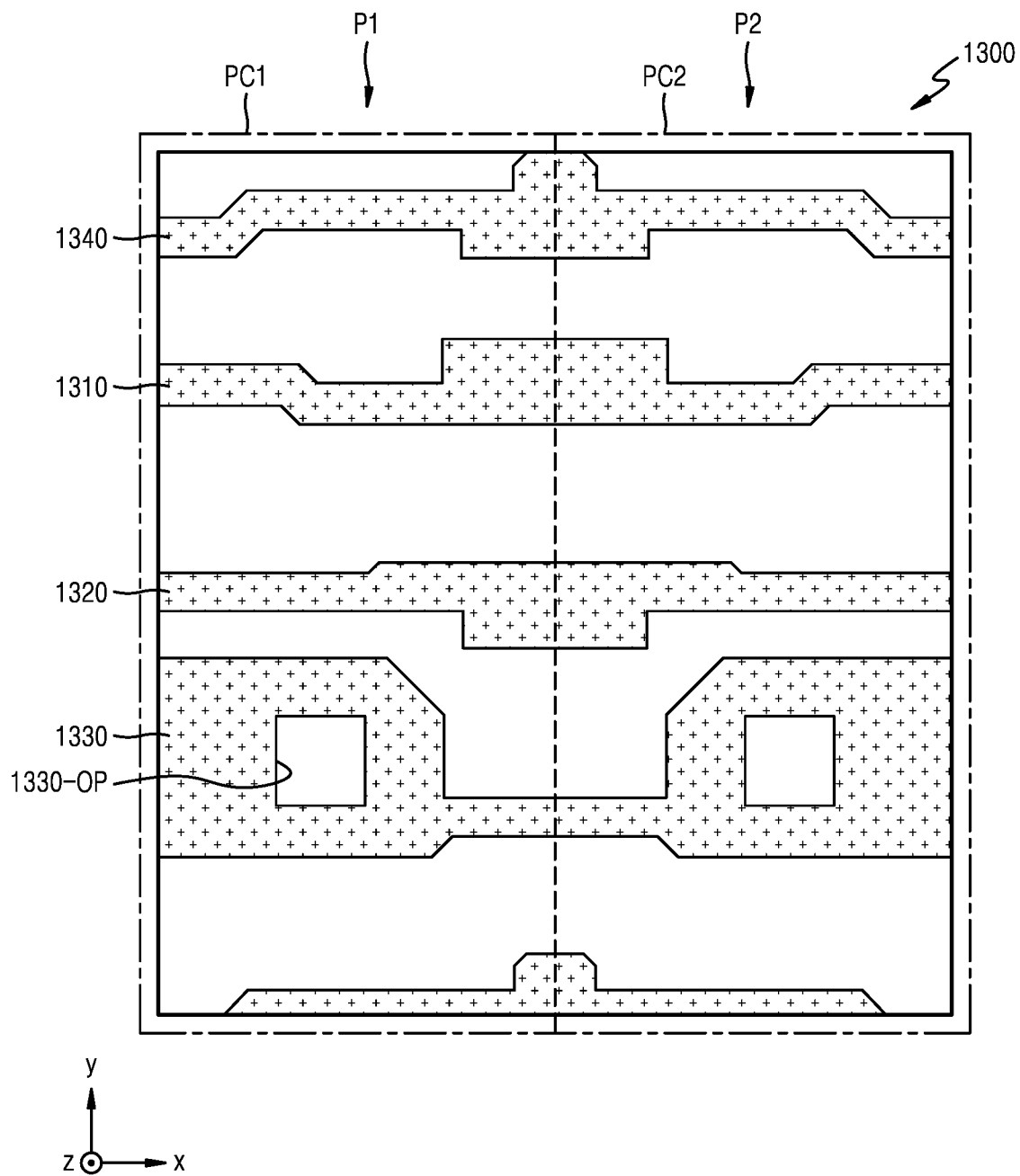

A first gate layer 1200 as shown in FIG. 9 may be disposed on the first gate insulating layer 113. In FIG. 9, the first gate layer 1200 is shown along with the first semiconductor layer 1100. The first gate layer 1200 may include a first gate wiring 1210, a first gate electrode 1220, and a second gate wiring 1230.

The first gate wiring 1210 may extend in the first direction (or x-axis direction). The first gate wiring 1210 may be the first scan line SL1 or the post scan line SLn shown in FIG. 6. For example, in the first pixel P1 as shown in FIG. 9, the first gate wiring 1210 corresponds to the first scan line SL1 of FIG. 6, and in the pixel adjacent to the pixel P1 (in the +y direction), the first gate wiring 1210 may correspond to the post scan line SLn of FIG. 6. Accordingly, the first scan signal Sn and the post scan signal Sn+1 may be applied to the pixels via the first gate wiring 1210. In the first gate wiring 1210, portions overlapping the first semiconductor layer 1100 may include the switching gate electrode of the switching transistor T2 and the second initialization gate electrode of the second initialization transistor T7.

The first gate electrode 1220 may have an isolated shape. The first gate electrode 1220 may be the driving gate electrode of the driving transistor T1. In the first semiconductor layer 1100, a portion overlapping the first gate electrode 1220 and a peripheral portion may be referred to as a driving semiconductor layer.

The second gate wiring 1230 may extend in the first direction (or x-axis direction). The second gate wiring 1230 may correspond to the emission control line EL of FIG. 6. In the second gate wiring 1230, portions overlapping the first semiconductor layer 1100 may include the operation control gate electrode of the operation control transistor T5 and the emission control gate electrode of the emission control transistor T6. The emission control signal En may be applied to the pixels via the second gate wiring 1230.

The first gate layer 1200 may include metal, an alloy, conductive metal oxide, a transparent conductive material, etc. For example, the first gate layer 1200 may include argentum (Ag), an alloy including argentum, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. The first gate layer 1200 may have a multi-layered structure, e.g., the first gate layer 1200 may include a dual-layered structure including Mo/Al or a triple-layered structure including Mo/Al/Mo.

A second gate insulating layer 115 (see FIG. 16) covers the first gate layer 1200 and may be disposed on the first gate insulating layer 113. The second gate insulating layer 115 may include an insulating material that is substantially identical or similar to that of the first gate insulating layer 113.

A second gate layer 1300 may be disposed on the second gate insulating layer 115. The second gate layer 1300 may include a third gate wiring 1310, a fourth gate wiring 1320, a capacitor upper electrode 1330, and a first initialization voltage wiring 1340 (for example, the first initialization voltage line VL1 of FIG. 6).

The third gate wiring 1310 may extend in the first direction (or x-axis direction). The third gate wiring 1310 may correspond to the previous scan line SLp of FIG. 6. When seen in the direction perpendicular to the substrate 100 (or z-axis direction), the third gate wiring 1310 may be spaced apart from the first gate wiring 1210. The previous scan signal Sn−1 may be applied to the pixels via the third gate wiring 1310. In the third gate wiring 1310, a portion overlapping a second semiconductor layer 1400 that will be described below may include a first initialization lower gate electrode of the first initialization transistor T4.

The fourth gate wiring 1320 may extend in the first direction (or x-axis direction). The fourth gate wiring 1320 may correspond to the second scan line SL2 of FIG. 6. When seen in the direction perpendicular to the substrate 100 (or z-axis direction), the fourth gate wiring 1320 may be spaced from the first gate wiring 1210 and the third gate wiring 1310. The second scan signal Sn' may be applied to the pixels via the fourth gate wiring 1320. In the fourth gate wiring 1320, a portion overlapping the second semiconductor layer 1400 that will be described below may include a compensation lower gate electrode of the compensation transistor T3.

The third gate wiring 1310 and the fourth gate wiring 1320 are under the second semiconductor layer 1400 that will be described below with reference to FIG. 11, and may function as lower protective metals for protecting portions of the second semiconductor layer 1400, which overlap the third gate wiring 1310 and the fourth gate wiring 1320, and as the gate electrodes.

The capacitor upper electrode 1330 overlaps the first gate electrode 1220 and extends in the first direction (or x-axis direction). The capacitor upper electrode 1330 corresponds to the second capacitor electrode CE2 of FIG. 6 and may configure the storage capacitor Cst along with the first gate electrode 1220. The driving voltage ELVDD may be applied to the capacitor upper electrode 1330. The capacitor upper electrode 1330 may include a hole penetrating therethrough, and at least a part of the first gate electrode 1220 may overlap the hole.

A first initialization voltage wiring 1340 corresponding to the first initialization voltage line VL1 of FIG. 6 may extend in the first direction (or x-axis direction). When seen in the direction perpendicular to the substrate 100 (or z-axis direction), the first initialization voltage wiring 1340 may be spaced apart from the third gate wiring 1310. The first initialization voltage Vint1 may be applied to the pixels via the first initialization voltage wiring 1340. The first initialization voltage wiring 1340 may at least partially overlap the second semiconductor layer 1400 that will be described below, and may be configured to transfer the first initialization voltage Vint1 to the second semiconductor layer 1400. The first initialization voltage wiring 1340 may be electrically connected to the second semiconductor layer 1400 via contact holes 1680CNT1, 1680CNT2, and 1680CNT3 that will be described below with reference to FIG. 13.

The second gate layer 1300 may include metal, an alloy, conductive metal oxide, a transparent conductive material, etc. For example, the second gate layer 1300 may include argentum (Ag), an alloy including argentum, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. The second gate layer 1300 may have a multi-layered structure, e.g., the second gate layer 1300 may include a double-layered structure including Mo/Al or a triple-layered structure including Mo/Al/Mo.

A first interlayer insulating layer 117 (see FIG. 16) covers the second gate layer 1300 and may be disposed on the second gate insulating layer 115. The first interlayer insulating layer 117 may include an insulating material. For example, the first interlayer insulating layer 117 may include silicon oxide, silicon nitride, silicon oxynitride, aluminum oxide, etc.

Figure 11:
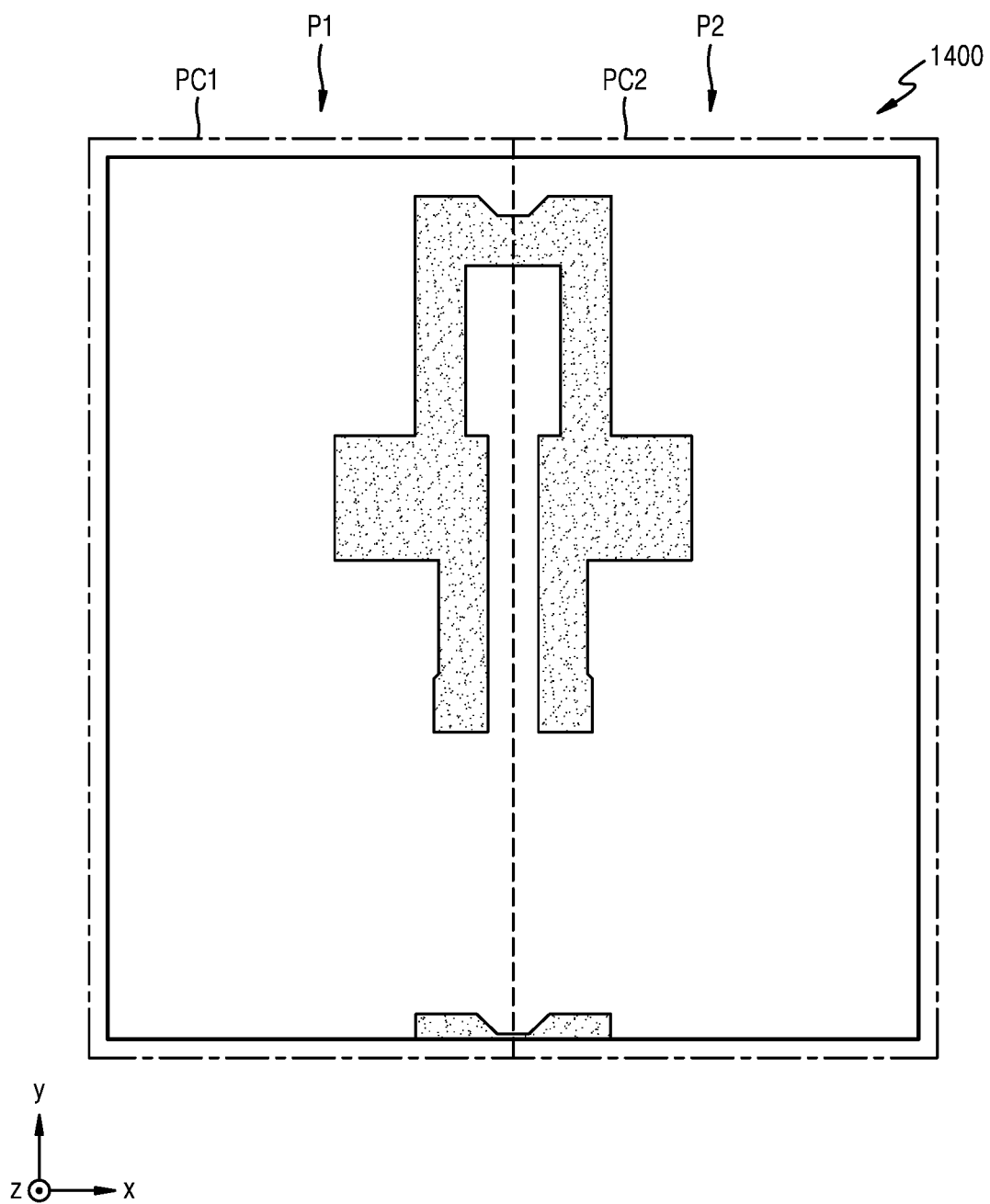

The second semiconductor layer 1400 as shown in FIG. 11 may be disposed on the first interlayer insulating layer 117. As described above, the second semiconductor layer 1400 may include oxide semiconductor. The second semiconductor layer 1400 may be disposed on a different layer from that of the first semiconductor layer 1100, and when seen in the direction perpendicular to the substrate 100 (or z-axis direction), the second semiconductor layer 1400 may not overlap the first semiconductor layer 1100.

A third gate insulating layer 118 (see FIG. 16) covers the second semiconductor layer 1400 and may be disposed on the first interlayer insulating layer 117. The third gate insulating layer 118 may include an insulating material. As shown in FIG. 16, the third gate insulating layer 118 may be disposed only on a part of the second semiconductor layer 1400 and may not be disposed on the first interlayer insulating layer 117. In the latter case, as shown in FIG. 16, the third gate insulating layer 118 and the third gate layer 1500 that will be described below with reference to FIG. 12 may have the same pattern. For example, when seen in the direction perpendicular to the substrate 100 (or z-axis direction), the third gate insulating layer 118 may completely or nearly completely overlap the second gate layer 1500. This is because the third gate insulating layer 118 and the second gate layer 1500 are simultaneously patterned. Therefore, in the second semiconductor layer 1400, source and drain regions may not be covered by the third gate insulating layer 118, except for channel regions overlapping the third gate layer 1500. The source and drain regions may directly contact the second interlayer insulating layer 119 as shown in FIG. 16. The third gate insulating layer 118 may include silicon oxide, silicon nitride, silicon oxynitride, aluminum oxide, etc.

Figure 12:
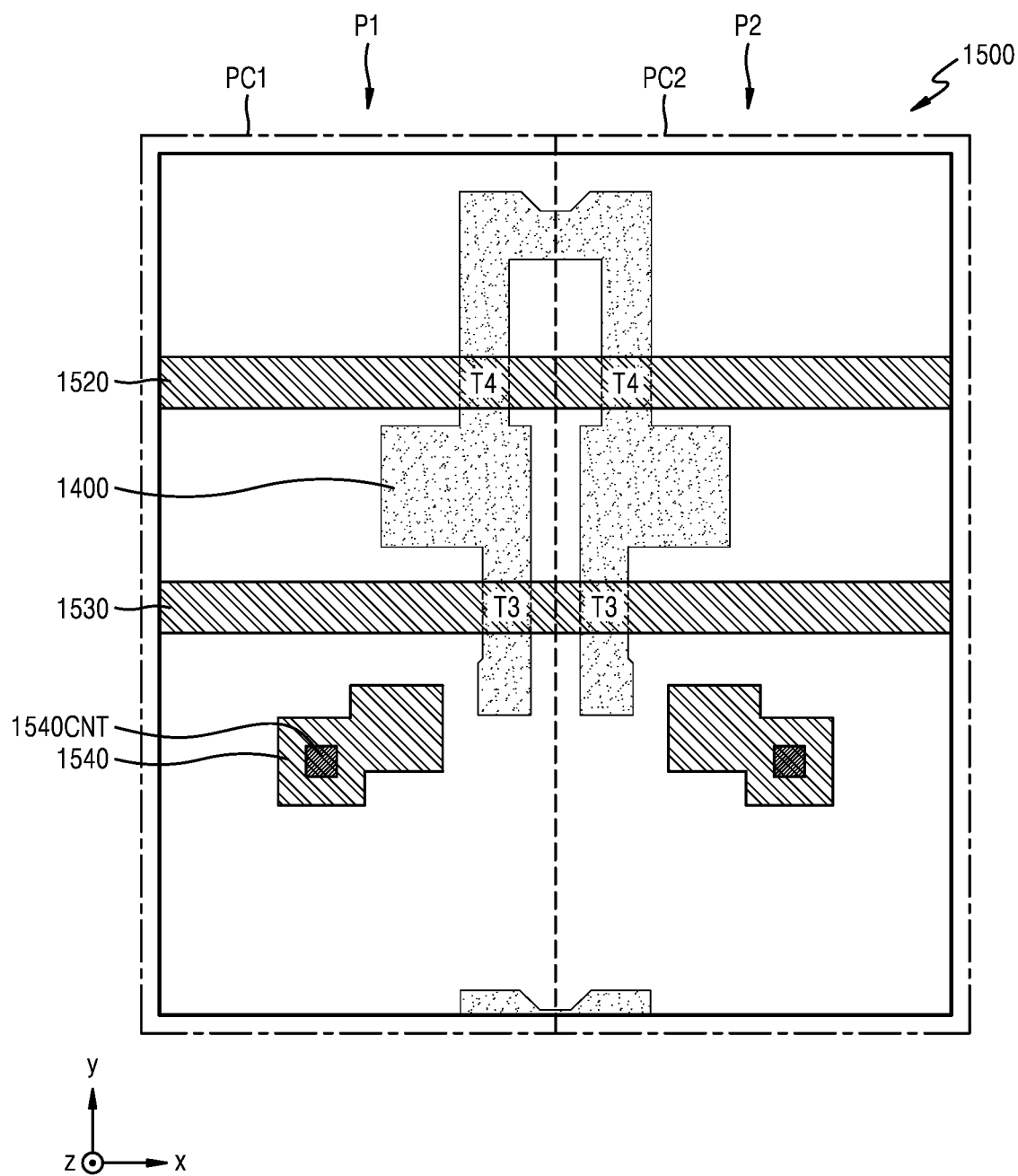

The third gate layer 1500 as shown in FIG. 12 may be disposed on the third gate insulating layer 118. The third gate layer 1500 may include a fifth gate wiring 1520, a sixth gate wiring 1530, and a first transfer wiring 1540.

The fifth gate wiring 1520 may extend in the first direction (or x-axis direction). When seen in the direction perpendicular to the substrate 100 (or z-axis direction), the fifth gate wiring 1520 may overlap the third gate wiring 1310. In the fifth gate wiring 1520, a portion overlapping the second semiconductor layer 1400 may include a first initialization upper gate electrode of the first initialization transistor T4. In the second semiconductor layer 1400, a portion overlapping the fifth gate wiring 1520 and a peripheral portion may be referred to as a first initialization semiconductor layer. The fifth gate wiring 1520 may be electrically connected to the third gate wiring 1310. For example, the fifth gate wiring 1520 may be electrically connected to the third gate wiring 1310 via a contact hole formed in an insulating layer between the fifth gate wiring 1520 and the third gate wiring 1310. Such a contact hole may be disposed in the display area DA or in the peripheral area PA. Accordingly, the fifth gate wiring 1520 may correspond to the previous scan line SLp of FIG. 6, along with the third gate wiring 1310. The previous scan signal Sn−1 may be applied to the pixels via the fifth gate wiring 1520 and/or the third gate wiring 1310.

The sixth gate wiring 1530 may extend in the first direction (or x-axis direction). When seen in the direction perpendicular to the substrate 100 (or z-axis direction), the sixth gate wiring 1530 may overlap the fourth gate wiring 1320. In the sixth gate wiring 1530, a portion overlapping the second semiconductor layer 1400 may include a compensation upper gate electrode of the compensation transistor T3. The sixth gate wiring 1530 may be electrically connected to the fourth gate wiring 1320. For example, the sixth gate wiring 1530 may be electrically connected to the fourth gate wiring 1320 via a contact hole formed in an insulating layer between the sixth gate wiring 1530 and the fourth gate wiring 1320. Such a contact hole may be disposed in the display area DA or in the peripheral area PA. Accordingly, the sixth gate wiring 1530 may correspond to the second scan line SL2 of FIG. 6, along with the fourth gate wiring 1320. Accordingly, the second scan signal Sn' may be applied to the pixels via the sixth gate wiring 1530 and/or the fourth gate wiring 1320.

The first transfer wiring 1540 may be electrically connected to the first gate electrode 1220, e.g., the driving gate electrode, via a contact hole 1540CNT that passes through an opening 1330-OP of the capacitor upper electrode 1330. The first transfer wiring 1540 may be configured to transfer the first initialization voltage Vint1 transferred through the first initialization transistor T4 to the first gate electrode 1220.

The third gate layer 1500 may include metal, an alloy, conductive metal oxide, a transparent conductive material, etc. For example, the third gate layer 1500 may include argentum (Ag), an alloy including argentum, molybdenum (Mo), an alloy including molybdenum, aluminum (Al), an alloy include aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. The third gate layer 1500 may have a multi-layered structure, e.g., the third gate layer 1500 may include a double-layered structure including Mo/Al or a triple-layered structure including Mo/Al/Mo.

A second interlayer insulating layer 119 (see FIG. 16) may at least partially cover (or overlap) the third gate layer 1500 of FIG. 12. The second interlayer insulating layer 119 may include an insulating material. For example, the second interlayer insulating layer 119 may include silicon oxide, silicon nitride, silicon oxynitride, aluminum oxide, etc.

Figure 13:
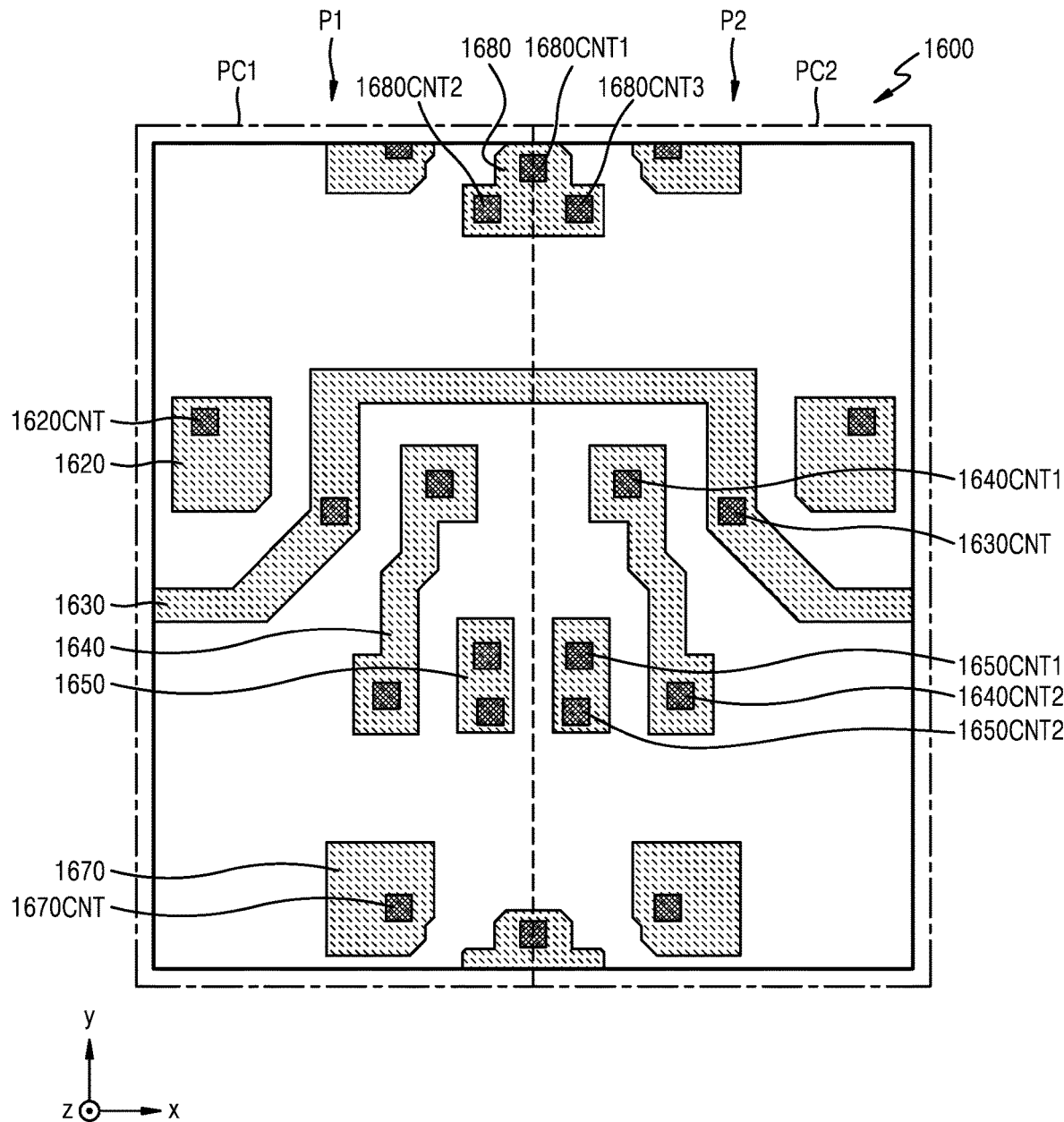

A first connecting electrode layer 1600 as shown in FIG. 13 may be disposed on the second interlayer insulating layer 119. The first connecting electrode layer 1600 may include a second transfer wiring 1620, a second initialization voltage wiring 1630, a third transfer wiring 1640, a fourth transfer wiring 1650, a fifth transfer wiring 1670, and a sixth transfer wiring 1680.

The second transfer wiring 1620 may be electrically connected to the first semiconductor layer 1100 via a contact hole 1620CNT. The data signal Dm from a data wiring 1810 that will be described below with reference to FIG. 15 may be transferred to the first semiconductor layer 1100 via the second transfer wiring 1620 and then may be applied to the switching transistor T2.

The second initialization voltage wiring 1630 may extend in the first direction (or x-axis direction). The second initialization voltage wiring 1630 corresponding to the second initialization voltage line VL2 of FIG. 6 may be configured to apply the second initialization voltage Vint2 to the pixels. The second initialization voltage wiring 1630 is electrically connected to the first semiconductor layer 1100 via a contact hole 1630CNT, and the second initialization voltage Vint2 may be transferred to the first semiconductor layer 1100 and applied to the second initialization transistor T7.

The third transfer wiring 1640 may electrically connect the second semiconductor layer 1400 to the first transfer wiring 1540 via contact holes 1640CNT1 and 1640CNT2 formed in a side and another side thereof. The first transfer wiring 1540 is electrically connected to the first gate electrode 1220, e.g., the driving gate electrode, and thus, the third transfer wiring 1640 may electrically connect the first initialization semiconductor layer that is a part of the second semiconductor layer 1400, to the driving gate electrode. The first initialization voltage Vint1 may be transferred to the first gate electrode 1220, e.g., the driving gate electrode, via the second semiconductor layer 1400, the third transfer wiring 1640, and the first transfer wiring 1540.

The fourth transfer wiring 1650 may electrically connect the second semiconductor layer 1400 to the first semiconductor layer 1100 via contact holes 1650CNT1 and 1650CNT2 formed in a side and another side thereof. For example, the fourth transfer wiring 1650 may electrically connect the compensation transistor T3 to the driving transistor T1.

The fifth transfer wiring 1670 may be electrically connected to the first semiconductor layer 1100 via a contact hole 1670CNT. The fifth transfer wiring 1670 may be configured to transfer the driving current or the second initialization voltage Vint2 from the first semiconductor layer 1100 to the organic light-emitting diode OLED.

The sixth transfer wiring 1680 may be electrically connected to the second semiconductor layer 1400 via the contact holes 1680CNT2 and 1680CNT3. The sixth transfer wiring 1680 may be electrically connected to the first initialization voltage wiring 1340 of FIG. 10 via the contact hole 1680CNT1. As such, the sixth transfer wiring 1680 may be configured to transfer the first initialization voltage Vint1 from the first initialization voltage wiring 1340 to the first initialization transistor T4.

The first connecting electrode layer 1600 may include metal, an alloy, conductive metal oxide, a transparent conductive material, etc. For example, the first connecting electrode layer 1600 may include argentum (Ag), an alloy including argentum, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. The first connecting electrode layer 1600 may have a multi-layered structure, e.g., a double-layered structure including Ti/Al or a triple-layered structure including Ti/Al/Ti.

A first planarized insulating layer 121 (see FIG. 16) covers the first connecting electrode layer 1600 and may be disposed on the second interlayer insulating layer 119. The first planarized insulating layer 121 may include an organic insulating material. For example, the first planarized insulating layer 121 may include photoresist, benzocyclobutene (BCB), polyimide, hexamethyldisiloxane (HMDSO), polymethylmethacrylate (PMMA), polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, or mixtures thereof.

A second connecting electrode layer 1700 as shown in FIG. 14 may be disposed on the first planarized insulating layer 121. The second connecting electrode layer 1700 may include a horizontal connection wiring 1710, a seventh transfer wiring 1720, an eighth transfer wiring 1760, and a ninth transfer wiring 1770.

The horizontal connection wiring 1710 may extend in the first direction (or x-axis direction). The horizontal connection wiring 1710 may be one of the first to third horizontal connection lines DH1 to DH3 and the first to third auxiliary horizontal connection line ADH1 to ADH3 described above with reference to FIG. 5, according to the location of the pixel. For example, the second connecting electrode layer 1700 may include the horizontal connection line and/or the auxiliary horizontal connection line. This will be described below along with the vertical connection wiring 1820 of FIG. 15.

The seventh transfer wiring 1720 may be electrically connected to the second transfer wiring 1620 via a contact hole 1720CNT. The data signal Dm from a data wiring 1810 that will be described below with reference to FIG. 15 may be transferred to the first semiconductor layer 1100 via the seventh transfer wiring 1720 and the second transfer wiring 1620 and then may be applied to the switching transistor T2.

The eighth transfer wiring 1760 may extend in the first direction (or x-axis direction). The driving voltage ELVDD from a driving voltage wiring 1830 that will be described below with reference to FIG. 15 is transferred to the eighth transfer wiring 1760, and the eighth transfer wiring 1760 electrically connected to the first semiconductor layer 1100 via a contact hole 1760CNT1 may be configured to transfer the driving voltage ELVDD to the first semiconductor layer 1100, in particular, the operation control transistor T5. The eighth transfer wiring 1760 electrically connected to the capacitor upper electrode 1330 (e.g., the second capacitor electrode CE2 of FIG. 6) via a contact hole 1760CNT may be configured to transfer the driving voltage ELVDD to the capacitor upper electrode 1330.

The ninth transfer wiring 1770 may be electrically connected to the fifth transfer wiring 1670 via a contact hole 1770CNT. The ninth transfer wiring 1770 may receive the driving current or the second initialization voltage Vint2 from the first semiconductor layer 1100 through the fifth transfer wiring 1670 and may be configured to transfer the driving current or the second initialization voltage Vint2 to the organic light-emitting diode OLED.

The second connecting electrode layer 1700 may include metal, an alloy, conductive metal oxide, a transparent conductive material, etc. For example, the second connecting electrode layer 1700 may include argentum (Ag), an alloy including argentum, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. The second connecting electrode layer 1700 may have a multi-layered structure, e.g., a double-layered structure including Ti/Al or a triple-layered structure including Ti/Al/Ti.

A second planarized insulating layer 123 (see FIG. 16) covers the second connecting electrode layer 1700 and may be disposed on the first planarized insulating layer 121. The second planarized insulating layer 123 may include an organic insulating material. For example, the second planarized insulating layer 123 may include photoresist, benzocyclobutene (BCB), polyimide, hexamethyldisiloxane (HMDSO), polymethylmethacrylate (PMMA), polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, or mixtures thereof.

A third connecting electrode layer 1800 as shown in FIG. 15 may be disposed on the second planarized insulating layer 123. The third connecting electrode layer 1800 may include a data wiring 1810, a vertical connection wiring 1820, a driving voltage wiring 1830, and a tenth transfer wiring 1840.

The data wiring 1810 may extend in the second direction (or y-axis direction). The data wiring 1810 may correspond to the data line DL of FIG. 6. The data wiring 1810 is electrically connected to the seventh transfer wiring 1720 via a contact hole 1810CNT, and the data signal Dm from the data wiring 1810 may be transferred to the first semiconductor layer 1100 via the seventh transfer wiring 1720 and the second transfer wiring 1620 and then may be applied to the switching transistor T2. The data wiring 1810 may include one of the first to sixth data lines DL1 to DL6 described above with reference to FIG. 5.

The vertical connection wiring 1820 may extend in the second direction (or y-axis direction). The vertical connection wiring 1820 may include one of the first to third vertical connection lines DV1' to DV3', the first to third additional vertical connection lines DV1 to DV3, the first to third auxiliary vertical connection lines ADV1' to ADV3', and the first to third additional auxiliary vertical connection lines ADV1 to ADV3 described above with reference to FIG. 5, according to the location of the pixel. For example, the third connecting electrode layer 1800 may include a vertical connection line, an additional vertical connection line, an auxiliary vertical connection line, and/or an additional auxiliary vertical connection line.

For example, the data wiring 1810 of FIG. 15 may correspond to the sixth data line DL6 of FIG. 5, the vertical connection wiring 1820 of FIG. 15 may correspond to the third vertical connection line DV3' of FIG. 5, and the horizontal connection wiring 1710 of FIG. 14 may correspond to the second auxiliary horizontal connection line ADH2 of FIG. 5. As another example, the data wiring 1810 of FIG. 15 may correspond to the fifth data line DL5 of FIG. 5, the vertical connection wiring 1820 of FIG. 15 may correspond to the third additional vertical connection line DV3 of FIG. 5, and the horizontal connection wiring 1710 of FIG. 14 may correspond to the first auxiliary horizontal connection line ADH1 of FIG. 5.

As another example, the data wiring 1810 of FIG. 15 may correspond to the fifth data line DL5 of FIG. 5, the vertical connection wiring 1820 of FIG. 15 may correspond to the third additional vertical connection line DV3 of FIG. 5, and the horizontal connection wiring 1710 of FIG. 14 may correspond to the third horizontal connection line DH3 of FIG. 5. In this case, the vertical connection wiring 1820 and the horizontal connection wiring 1710 may be electrically connected to each other in the display area DA (see FIG. 5) via a contact hole (not shown in FIG. 15) formed in the insulating layer between the vertical connection wiring 1820 and the horizontal connection wiring 1710. The contact hole formed in the insulating layer between the vertical connection wiring 1820 and the horizontal connection wiring 1710 may be the first connecting contact hole DH-CNT1 described above with reference to FIG. 5.

As another example, the data wiring 1810 of FIG. 15 may correspond to the fourth data line DL4 of FIG. 5, the vertical connection wiring 1820 of FIG. 15 may correspond to the second auxiliary vertical connection line ADV2', and the horizontal connection wiring 1710 of FIG. 14 may correspond to the third horizontal connection line DH3 of FIG. 5. As another example, the data wiring 1810 of FIG. 15 may correspond to the third data line DL3 of FIG. 5, the vertical connection wiring 1820 of FIG. 15 may correspond to the second additional auxiliary vertical connection line ADV2, and the horizontal connection wiring 1710 of FIG. 14 may correspond to the third horizontal connection line DH3 of FIG. 5.

According to the location of the pixel, the data wiring 1810 of FIG. 15 may correspond to the sixth data line DL6 of FIG. 5, the vertical connection wiring 1820 of FIG. 15 may correspond to the third vertical connection line DV3' of FIG. 5, and the horizontal connection wiring 1710 of FIG. 14 may correspond to the third horizontal connection line DH3 of FIG. 5. In this case, the vertical connection wiring 1820 and the horizontal connection wiring 1710 may be electrically connected to each other in the display area DA (see FIG. 5) via a contact hole (not shown in FIG. 15) formed in the insulating layer between the vertical connection wiring 1820 and the horizontal connection wiring 1710. The contact hole formed in the insulating layer between the vertical connection wiring 1820 and the horizontal connection wiring 1710 may be the second connecting contact hole DH-CNT2 described above with reference to FIG. 5. The vertical connection wiring 1820 may be electrically connected to the data wiring 1810 in the peripheral area PA outside the display area DA, as being integrally formed as a single body with the data wiring 1810 as described above with reference to FIG. 5.

The first to sixth input lines IL1 to IL6 described above with reference to FIG. 5 may be under the vertical connection wiring 1820. For example, the first to sixth input lines IL1 to IL6 may be disposed in the first gate layer 1200, the second gate layer 1300, the third gate layer 1500, the first connecting electrode layer 1600, or the second connecting electrode layer 1700. As another example, the first to sixth input lines IL1 to IL6 may each have a structure in which at least two of the conductive layer in the first gate layer 1200, the conductive layer in the second gate layer 1300, the conductive layer in the third gate layer 1500, the conductive layer in the first connecting electrode layer 1600, and the conductive layer in the second connecting electrode layer 1700 are connected to each other via a contact hole.

As described above with reference to FIG. 12, the fifth gate wiring 1520 extending in the first direction (or x-axis direction) and having a portion overlapping the second semiconductor layer 1400, the portion being the first initialization upper gate electrode of the first initialization transistor T4, intersects the vertical connection wiring 1820 when viewed in the direction perpendicular to the substrate 100 (or z-axis direction). If the fifth gate wiring 1520 and the vertical connection wiring 1820 are close to each other, there may be noise in the electrical signal transferred through the fifth gate wiring 1520 or in the electrical signal transferred through the vertical connection wiring 1820 due to a coupling effect. However, in the display apparatus, the fifth gate wiring 1520 is in the third gate layer 1500 and the vertical connection wiring 1820 is in the third connecting electrode layer 1800, and thus, the second interlayer insulating layer 119, the first planarized insulating layer 121, and the second planarized insulating layer 123 are interposed between the fifth gate wiring 1520 and the vertical connection wiring 1820. Therefore, the fifth gate wiring 1520 and the vertical connection wiring 1820 are sufficiently far from each other, and thus, the coupling effect between the fifth gate wiring 1520 and the vertical connection wiring 1820 may be effectively prevented or reduced.

The driving voltage wiring 1830 may extend in the second direction (or y-axis direction). The driving voltage wiring 1830 may correspond to the driving voltage line PL of FIG. 6. The driving voltage wiring 1830 may apply the driving voltage ELVDD to the pixels. The driving voltage wiring 1830 is electrically connected to the eighth transfer wiring 1760 via a contact hole 1830CNT, and as described above, the driving voltage ELVDD may be transferred to the operation control transistor T5 and the capacitor upper electrode 1330. The driving voltage wiring 1830 of the first pixel circuit PC1 and the driving voltage wiring 1830 of the adjacent second pixel circuit PC2 may be integrally formed as a single body.

The tenth transfer wiring 1840 is electrically connected to the ninth transfer wiring 1770 via a contact hole 1840CNT1 and may receive the driving current from the first semiconductor layer 1100 or the second initialization voltage Vint2 from the fifth transfer wiring 1670 and the ninth transfer wiring 1770. The tenth transfer wiring 1840 may be configured to transfer the driving current from the first semiconductor layer 1100 or the second initialization voltage Vint2 to the first electrode (or pixel electrode) of the organic light-emitting diode OLED via a contact hole 1840CNT2 formed in the insulating layer located thereon.

The third connecting electrode layer 1800 may include metal, an alloy, conductive metal oxide, a transparent conductive material, etc. For example, the third connecting electrode layer 1800 may include argentum (Ag), an alloy including argentum, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. The third connecting electrode layer 1800 may have a multi-layered structure, e.g., a double-layered structure including Ti/Al or a triple-layered structure including Ti/Al/Ti.

A third planarized insulating layer 125 as shown in FIG. 16 covers the third connecting electrode layer 1800 and may be disposed on the second planarized insulating layer 123. The third planarized insulating layer 125 may include an organic insulating material. For example, the third planarized insulating layer 125 may include benzocyclobutene (BCB), polyimide, hexamethyldisiloxane (HMDSO), polymethylmethacrylate (PMMA), polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, or mixtures thereof.

The organic light-emitting diode OLED may be disposed on the third planarized insulating layer 125. The organic light-emitting diode OLED may include a pixel electrode 210, that is, a first electrode, an intermediate layer 220 including an emission layer, and an opposite electrode 230, that is, a second electrode.

The pixel electrode 210 may include a transmissive or semi-transmissive electrode or a reflective electrode. For example, the pixel electrode 210 may include a reflective layer including Ag, Mg, Al, Pt, Pd, Au, Ni, Nd, Ir, Cr, and a compound thereof, and a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide, and aluminum zinc oxide (AZO). For example, the pixel electrode 210 may have a triple-layered structure including ITO/Ag/ITO.

A pixel defining layer 127 may be disposed on the third planarized insulating layer 125. The pixel defining layer 127 increases a distance between an edge of the pixel electrode 210 and the opposite electrode 230 on the pixel electrode 210 to prevent generation of an arc at the edge of the pixel electrode 210.

The pixel defining layer 127 may include one or more organic insulating materials selected from the group consisting of polyimide, polyamide, acryl resin, benzocyclobutene, and phenol resin, and may be manufactured by a spin coating method, etc.

At least a part of the intermediate layer 220 in the organic light-emitting diode OLED may be disposed in an opening OP formed by the pixel defining layer 127. An emission area EA of the organic light-emitting diode OLED may be defined by the opening OP.

The intermediate layer 220 may include an emission layer. The emission layer may include an organic material including a fluorescent or phosphoric material emitting red light, green light, blue light, or white light. The emission layer may include a low-molecular weight organic material or a polymer organic material, and functional layers such as a hole transport layer (HTL), a hole injection layer (HIL), an electron transport layer (ETL), and an electron injection layer (EIL) may be selectively arranged under and on the emission layer.

The emission layer may be patterned to correspond to each of the pixel electrodes 210. Other layers than the emission layer included in the intermediate layer 220 may be variously modified, e.g., may be integrally provided throughout pixel electrodes 210.

The opposite electrode 230 may include a transmissive electrode or a reflective electrode. For example, the opposite electrode 230 may be a transparent or a semi-transparent electrode and may include a metal thin film including Li, Ca, LiF/Ca, LiF/Al, Al, Ag, Mg, and a compound thereof having a small work function. The opposite electrode 230 may further include a transparent conductive oxide (TCO) layer such as ITO, IZO, ZnO, $In_2O_3$, etc. on the metal thin film. The opposite electrode 230 is integrally provided throughout the entire surface of the display area DA and may be disposed on the intermediate layer 220 and the pixel defining layer 127.

Figure 17:
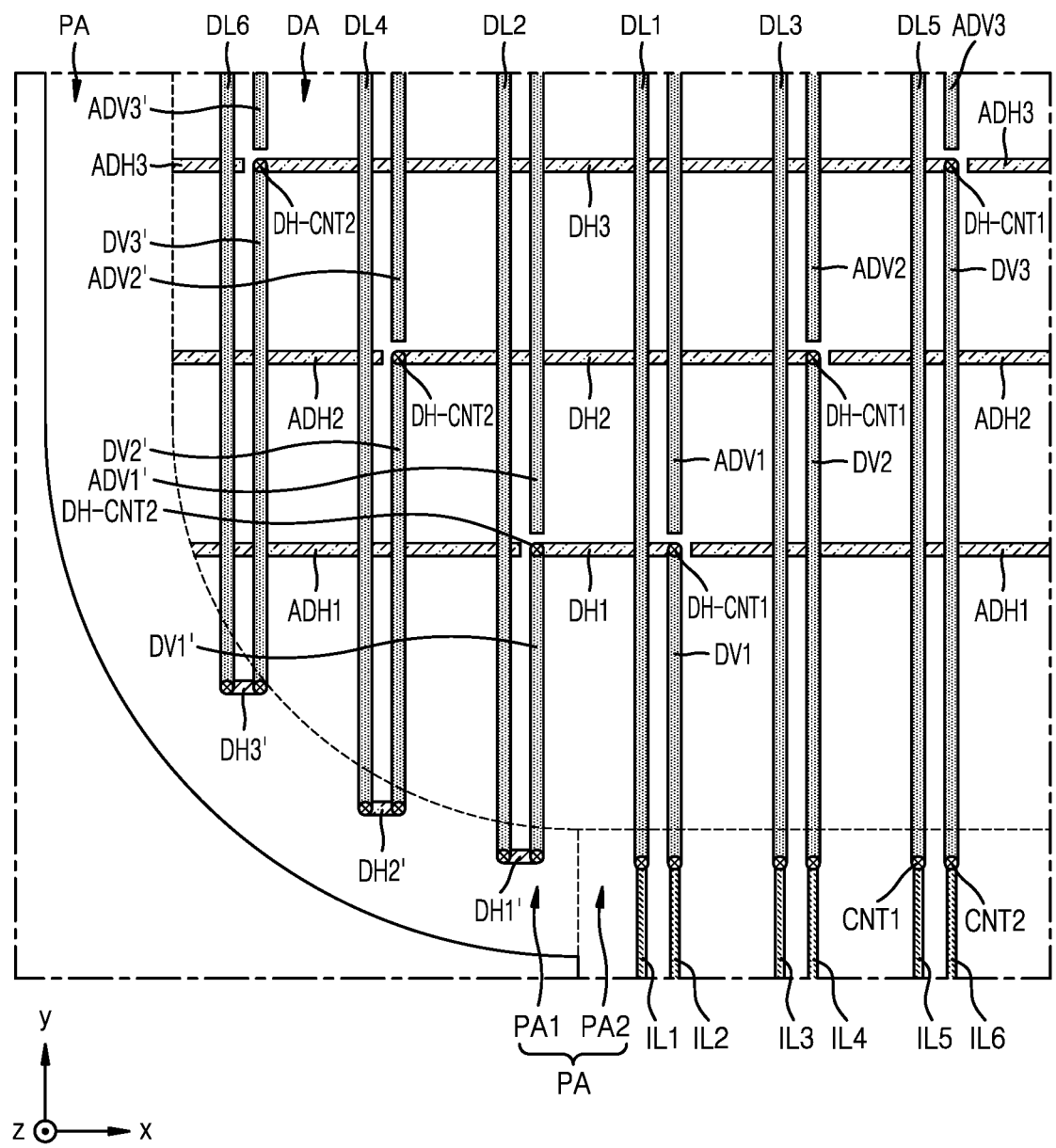
FIG. 17 is a schematic plan view illustrating a region of a display apparatus according to an embodiment.

FIG. 5 illustrates that each of the first vertical connection line DV1', the second vertical connection line DV2', and the third vertical connection line DV3' is integrally formed as a single body along (or integral with) a corresponding one of the second data line DL2, the fourth data line DL4, and the sixth data line DL6. However, one or more embodiments are not limited thereto. For example, as shown in FIG. 17 that is a schematic plan view illustrating a region in the display apparatus, the first vertical connection line DV1' may be electrically connected to the second data line DL2 via a first horizontal intermediate line DH1', the second vertical connection line DV2' may be electrically connected to the fourth data line DL4 via a second horizontal intermediate line DH2', and the third vertical connection line DV3' may be electrically connected to the sixth data line DL6 via a third horizontal intermediate line DH3'.

The third connecting electrode layer 1800 as shown in FIG. 15 may include the first vertical connection line DV1', the second vertical connection line DV2', the third vertical connection line DV3', the second data line DL2, the fourth data line DL4, and the sixth data line DL6, and thus, the first horizontal intermediate line DH1', the second horizontal intermediate line DH2', and the third horizontal intermediate line DH3' may be disposed in the conductive layer under the third connecting electrode layer 1800. For example, the second connecting electrode layer 1700 as shown in FIG. 14 may include the first to third horizontal intermediate lines DH1', DH2', and DH3'.

Figure 18:
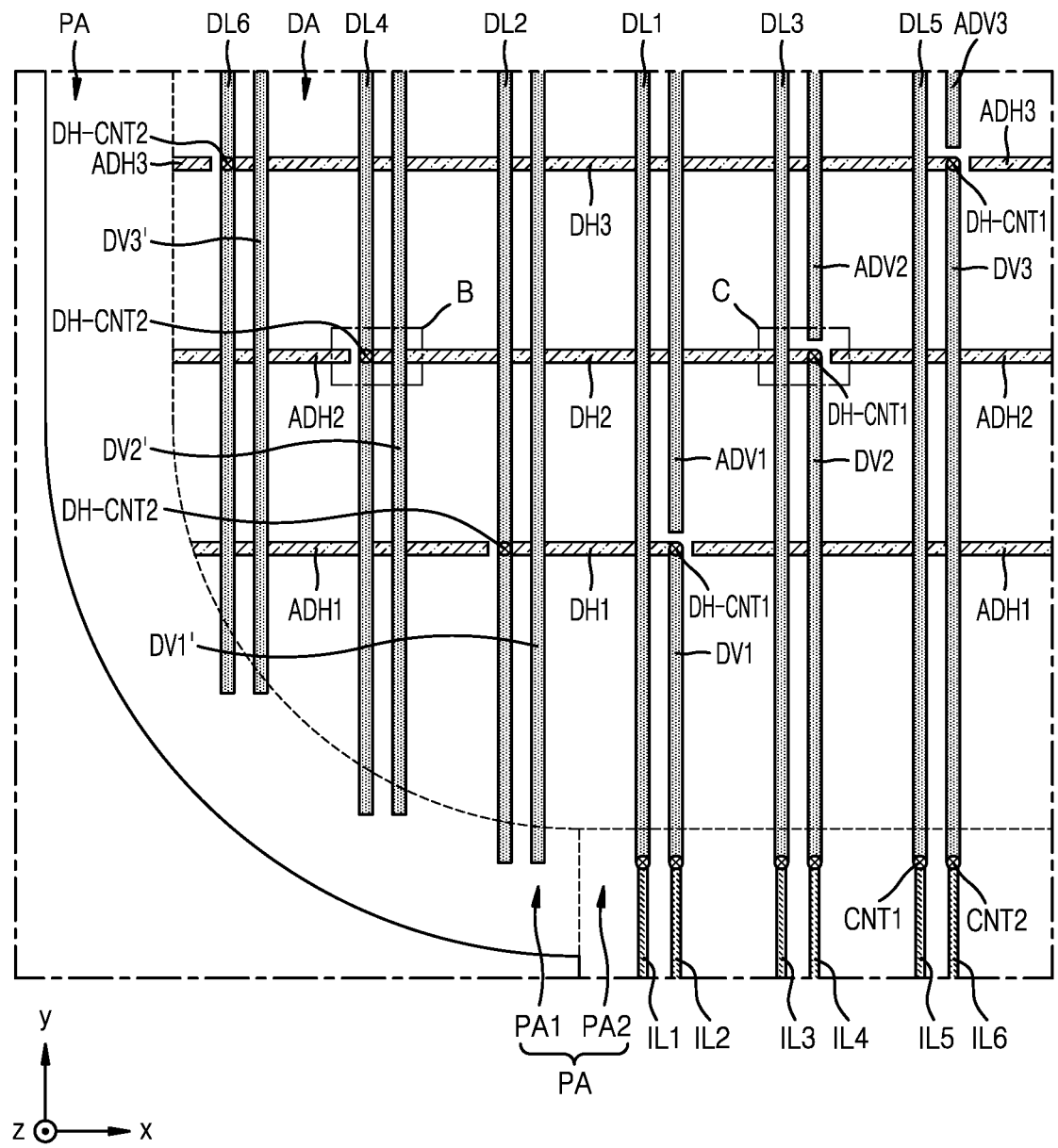
FIG. 18 is a schematic plan view illustrating a region of a display apparatus according to an embodiment.

FIG. 18 is a schematic plan view illustrating a region of a display apparatus according to an embodiment. The display apparatus is different from the display apparatus described above with reference to FIG. 5 in that each of the first horizontal connection line DH1, the second horizontal connection line DH2, and the third horizontal connection line DH3 is electrically connected to a corresponding one of the second data line DL2, the fourth data line DL4, and the sixth data line DL6 via a contact hole in the display area DA. In FIG. 18, each of the first horizontal connection line DH1, the second horizontal connection line DH2, and the third horizontal connection line DH3 is electrically connected to a corresponding one among the second data line DL2, the fourth data line DL4, and the sixth data line DL6 via a second connecting contact hole DH-CNT2 at an opposite end (in the −x direction) thereof. Each of the first horizontal connection line DH1, the second horizontal connection line DH2, and the third horizontal connection line DH3 may be electrically connected to a corresponding one of first additional vertical connection line DV1, the second additional vertical connection line DV2, and the third additional vertical connection line DV3 via a first connecting contact hole DH-CNT1 at an end (in the +x direction) thereof, respectively. As such, the second, fourth, and sixth data lines DL2, DL4, and DL6 may receive data signals from the second, fourth, and sixth input lines IL2, IL4, and IL6, respectively.

The first vertical connection line DV1', the second vertical connection line DV2', and the third vertical connection line DV3' may not be electrically connected to the data lines or the horizontal connection lines. Therefore, the first vertical connection line DV1', the second vertical connection line DV2', and the third vertical connection line DV3' respectively intersecting the first horizontal connection line DH1, the second horizontal connection line DH2, and the third horizontal connection line DH3 may be omitted. However, the first vertical connection line DV1' passes the pixels through which the second data line DL2 passes, the second vertical connection line DV2' passes the pixels through which the fourth data line DL4 passes, and the third vertical connection line DV3' passes the pixels through which the sixth data line DL6 passes such that the pixels through which the first data line DL1 and the first additional vertical connection line DV1 pass, the pixels through which the third data line DL3 and the second additional vertical connection line DV2 pass, and the pixels through which the fifth data line DL5 and the third additional vertical connection line DV3 pass may have substantially identical or similar structures to those of the pixels through which the second data line DL2, the fourth data line DL4, and the sixth data line DL6 pass. As such, the display apparatus capable of displaying high-quality images may be implemented.

As shown in FIG. 18, the display apparatus may include the first auxiliary horizontal connection line ADH1 that is spaced apart from the first horizontal connection line DH1 to be electrically insulated from the first horizontal connection line DH1 and the second data line DL2 and has an extending axis that is substantially identical to that of the first horizontal connection line DH1. In particular, the display apparatus may include the first auxiliary horizontal connection line ADH1 at a side (in the −x direction) of the first horizontal connection line DH1, and the first auxiliary horizontal connection line ADH1 at an opposite side (the +x direction) of the first horizontal connection line DH1. Likewise, the display apparatus may include a second auxiliary horizontal connection line ADH2 at a side (the −x direction) of the second horizontal connection line DH2 and a second auxiliary horizontal connection line ADH2 at an opposite side (the +x direction) of the second horizontal connection line DH2, and a third auxiliary horizontal connection line ADH3 at a side (the −x direction) of the third horizontal connection line DH3 and a third auxiliary horizontal connection line ADH3 at an opposite side (the +x direction) of the third horizontal connection line DH3.

As such, a structural difference between the pixels through which the first to third horizontal connection lines DH1 to DH3 pass and the pixels through which the first to third horizontal connection lines DH1 to DH3 do not pass, may be reduced. Thus, a variation in luminance realized by the pixels in case that the same electrical signal is applied to the pixels may be reduced, and the display apparatus capable of displaying high-quality images may be implemented. The first to third auxiliary horizontal connection line ADH1 to ADH3 and the first to third horizontal connection lines DH1 to DH3 may be disposed on the same layer.

Similarly, the display apparatus may include a first additional auxiliary vertical connection line ADV1 that is spaced apart from the first additional vertical connection line DV1 to be electrically insulated from the first additional vertical connection line DV1 and the first horizontal connection line DH1, and that has the same extending axis as that of the first additional vertical connection line DV1 to be at a side (the +y direction) of the first additional vertical connection line DV1. Likewise, the display apparatus may include a second additional auxiliary vertical connection line ADV2 at a side (in the +y direction) of the second additional vertical connection line DV2, and a third additional auxiliary vertical connection line ADV3 at a side (in the +y direction) of the third additional vertical connection line DV3. The first to third additional auxiliary vertical connection lines ADV1 to ADV3 and the first to third additional vertical connection lines DV1 to DV3 may be disposed on the same layer.

As such, a structural difference between the pixels through which the first to third additional vertical connection line DV1 to DV3 pass and the pixels through which the first to third additional vertical connection line DV1 to DV3 do not pass, may be reduced. Thus, a variation in luminance realized by the pixels in case that the same electrical signal is applied to the pixels may be reduced, and the display apparatus capable of displaying high-quality images may be implemented.

The above description with reference to FIG. 5 may be applied to the display apparatus of FIG. 18, except for the differences between the embodiments of FIGS. 5 and 18.

Figure 19:
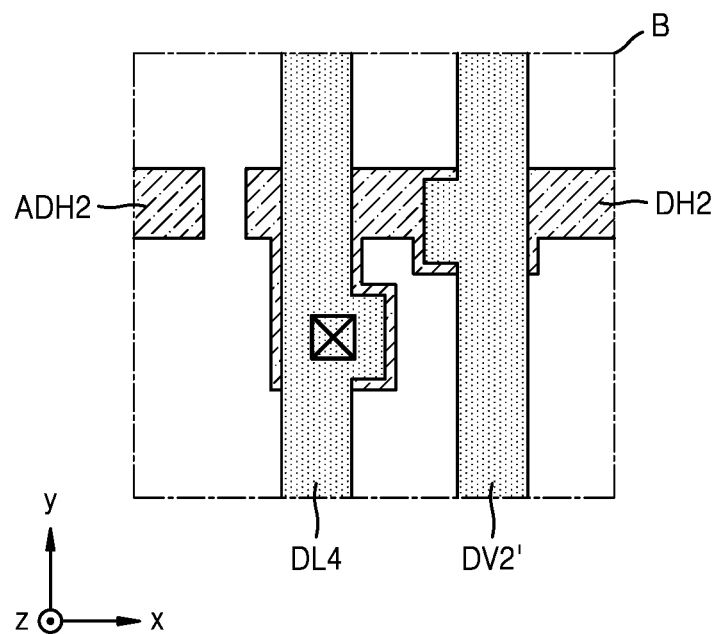
FIGS. 19 and 20 are schematic plan views illustrating enlarged views of a portion B and a portion C in the display apparatus of FIG. 18.
Figure 20:
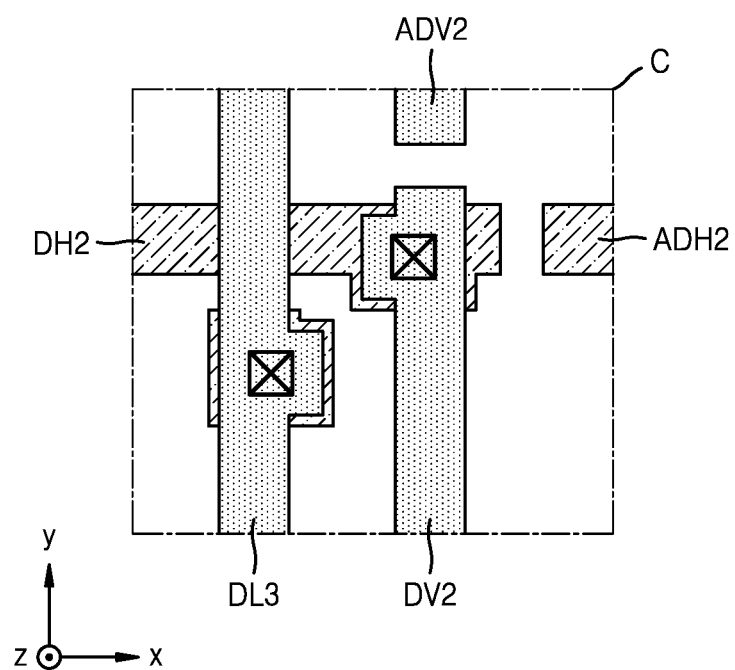

FIGS. 19 and 20 are schematic plan views illustrating enlarged views of a portion B and a portion C in the display apparatus of FIG. 18. As described above with reference to FIG. 18, the second horizontal connection line DH2 is electrically connected to the fourth data line D4 via the second connecting contact hole DH-CNT2 at the opposite end (in the −x direction) thereof, and thus, the second horizontal connection line DH2 extending in the first direction (the x-axis direction) as shown in FIG. 19 has a portion protruding in the second direction (the y-axis direction), in which the fourth data line DL4 extends, at a part of the second horizontal connection line DH2, overlapping the fourth data line DL4, and the second horizontal connection line DH2 may be electrically connected to the fourth data line DL4 at the protruding portion via the second connecting contact hole DH-CNT2.

As described above with reference to FIG. 18, the second horizontal connection line DH2 is electrically connected to the second additional vertical connection line DV2 via the first connecting contact hole DH-CNT1 at the opposite end (in the +x direction) thereof. As shown in FIG. 20, the third data line DL3 intersects the second horizontal connection line DH2, but is not electrically connected to the second horizontal connection line DH2. However, an island that is disposed on the same layer as the second horizontal connection line DH2, includes the same material, and is spaced apart from the second horizontal connection line DH2, is under the third data line DL3, and the third data line DL3 may be electrically connected to the island via a contact hole. As such, the third data line DL3 as shown in FIG. 20 may have a contact hole connecting structure that is similar to that of the fourth data line DL4 as shown in FIG. 19, and the pixels may have a substantially identical or similar structure(s).

Figure 21:
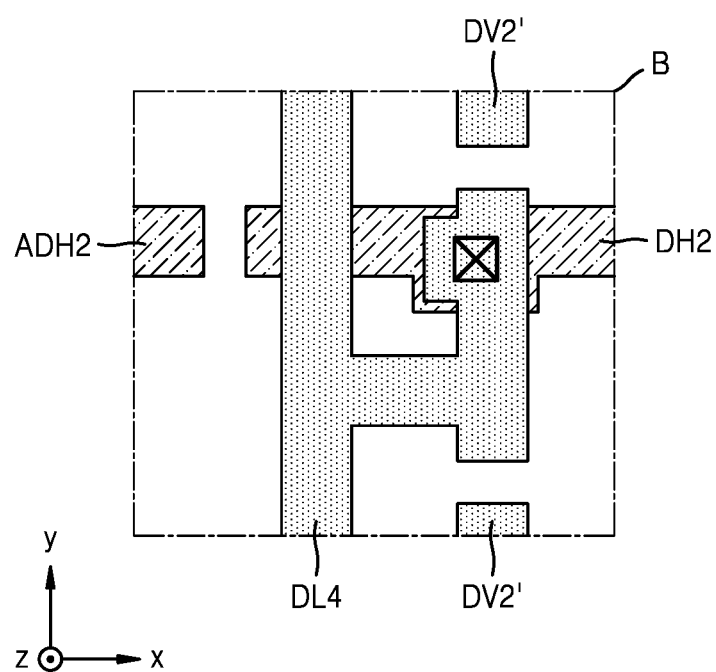
FIGS. 21 and 22 are schematic plan views illustrating enlarged views of some regions in a display apparatus according to an embodiment.
Figure 22:
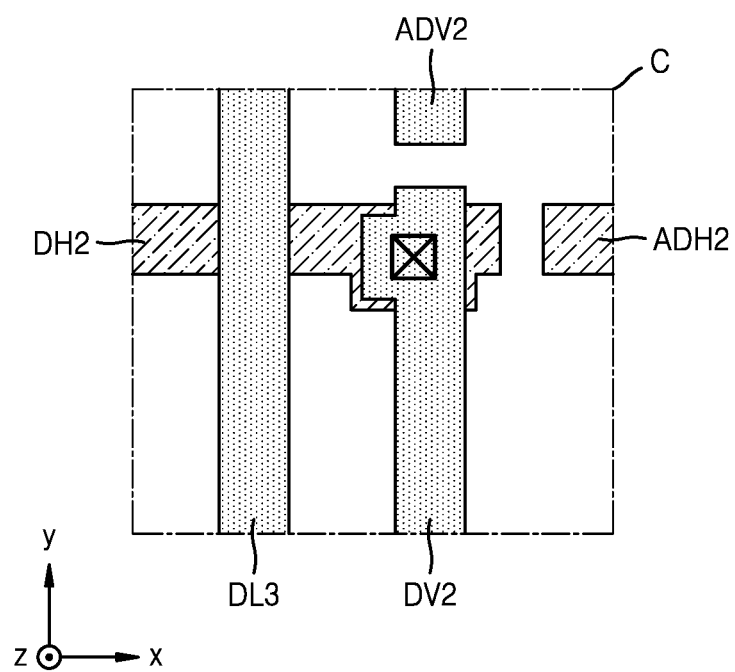

FIGS. 21 and 22 are schematic plan views illustrating enlarged views of some regions in a display apparatus according to an embodiment. As shown in FIG. 21, unlike the above description with reference to FIG. 19, the second horizontal connection line DH2 that extends in the first direction (or x-axis direction) may not include a protrusion. Instead, the second vertical connection line DV2' may be cut based on a first portion that overlaps the second horizontal connection line DH2, and the first portion overlapping the second horizontal connection line DH2 may be integral with the fourth data line DL4. In the first portion overlapping the second horizontal connection line DH2, the second horizontal connection line DH2 may be electrically connected to the fourth data line DL4 via the second connecting contact hole DH-CNT2. In this case, as shown in FIG. 22, there is no island under the third data line DL3 unlike the example described above with reference to FIG. 20. Even in case that there is no island, the third data line DL3 as shown in FIG. 22 may have a structure similar to that of the fourth data line DL4 as shown in FIG. 21.

Figure 23:
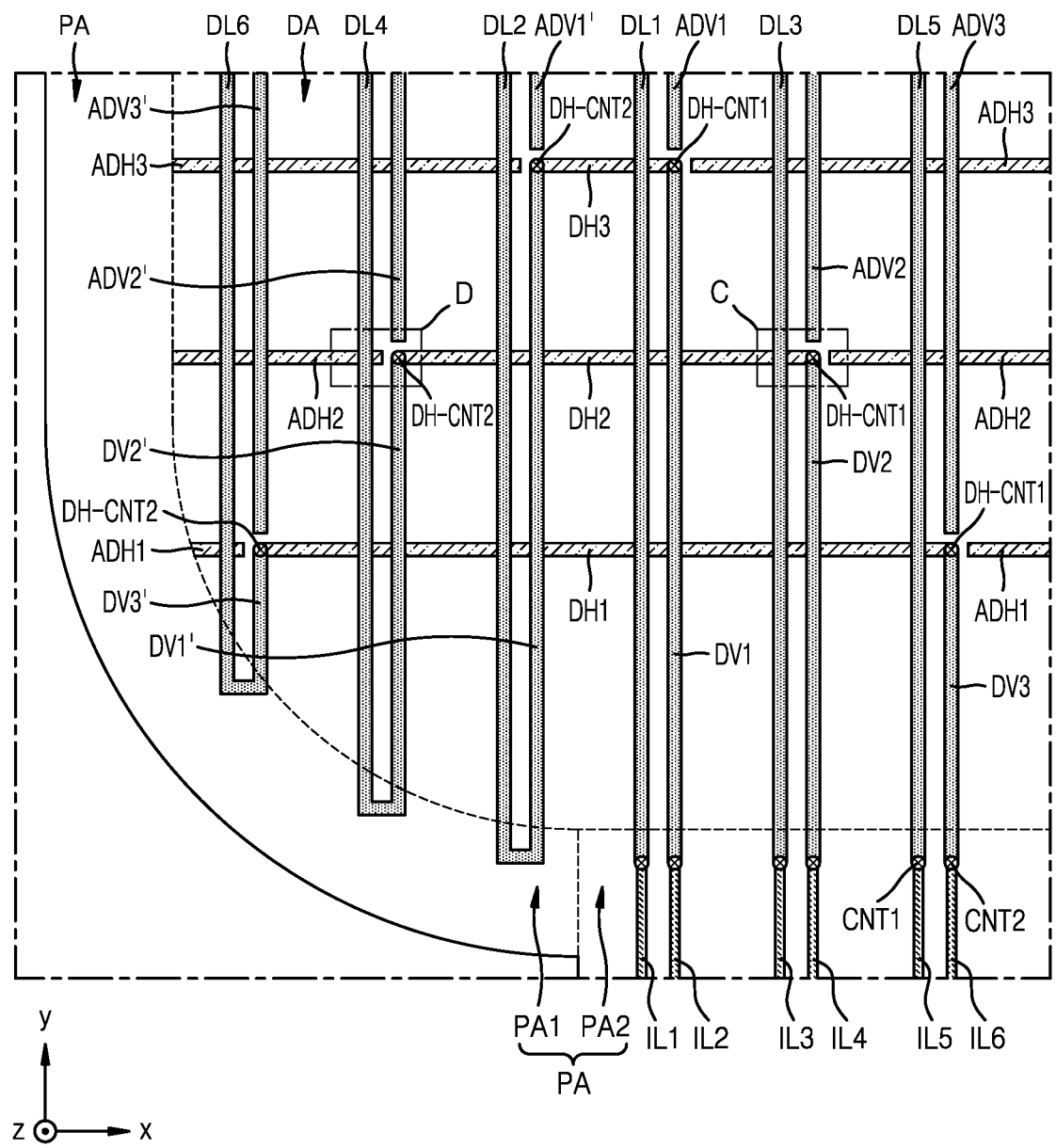
FIG. 23 is a schematic plan view illustrating a region of a display apparatus according to an embodiment.

FIG. 23 is a schematic plan view illustrating a region of a display apparatus according to an embodiment. The display apparatus is different from the display apparatus described above with reference to FIG. 5 in that lengths of the first vertical connection line DV1' and the first additional vertical connection line DV1 of FIG. 23 are greater than those of the first vertical connection line DV1' and the first additional vertical connection line DV1 of FIG. 5 and lengths of the third vertical connection line DV3' and the third additional vertical connection line DV3 of FIG. 23 are less than those of the third vertical connection line DV3' and the third additional vertical connection line DV3 of FIG. 5.

As shown in FIG. 23, among the first to third horizontal connection lines DH1 to DH3, the first horizontal connection line DH1 may be the longest, and the third horizontal connection line DH3 may be the shortest. Therefore, the third vertical connection line DV3' and the third additional vertical connection line DV3 electrically connected to the longest first horizontal connection line DH1 may have the smallest lengths, and the first vertical connection line DV1' and the first additional vertical connection line DV1 electrically connected to the shortest third horizontal connection line DH3 may have the greatest lengths. Thus, connecting lengths of the sixth data line DL6 and the sixth input line IL6, connecting lengths of the fourth data line DL4 and the fourth input line IL4, and connecting lengths of the second data line DL2 and the second input line IL2 may be substantially identical or similar to one another. As such, distortion of the data signals due to voltage drop that is generated as the connecting lengths vary may be reduced.

Figure 24:
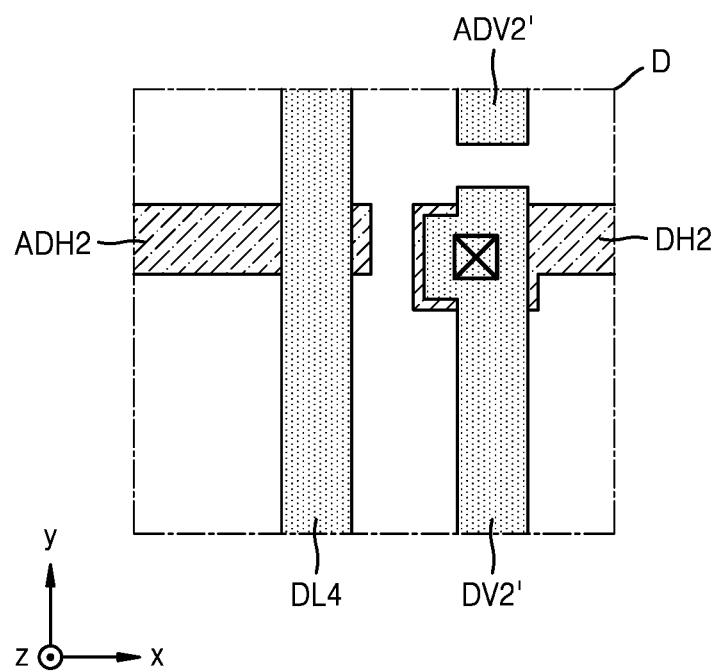
FIG. 24 is a schematic plan view illustrating an enlarged view of a portion D in the display apparatus of FIG. 23.

In FIG. 23, a portion indicated as C and portion C described above with reference to FIG. 20 or 22 may have the same structure. A portion D in FIG. 23, where the second vertical connection line DV2' and the second horizontal connection line DH2 are electrically connected to each other, and portion D illustrated in FIG. 24 may have the same structure. As shown in FIG. 24, the fourth data line DL4 intersects the second auxiliary horizontal connection line ADH2 and extends in the second direction (in the y-axis direction), and the second vertical connection line DV2' may be electrically connected to the second horizontal connection line DH2 via the contact hole.

Figure 25:
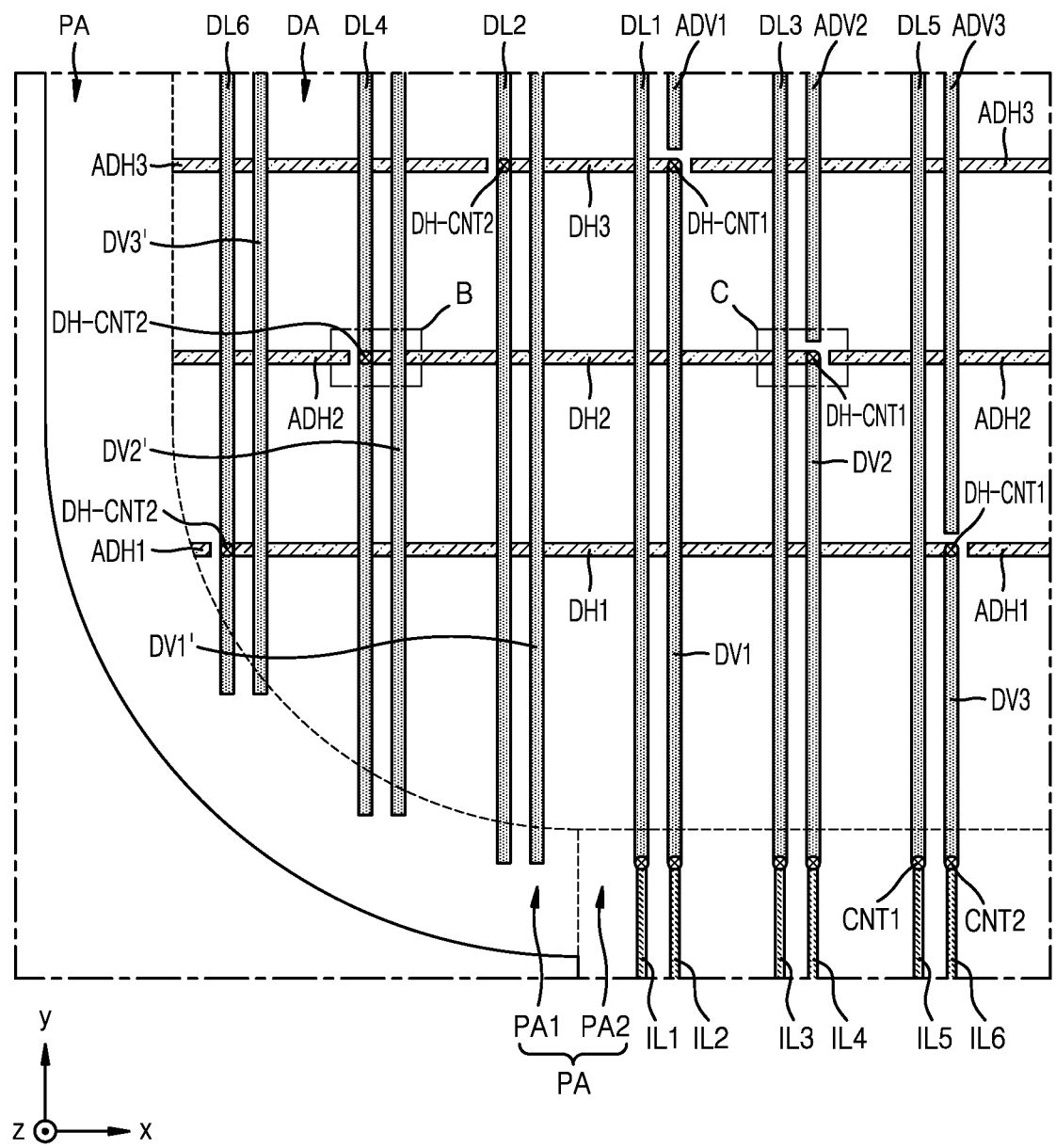
FIG. 25 is a schematic plan view illustrating a region of a display apparatus according to an embodiment.

FIG. 25 is a schematic plan view illustrating a region of a display apparatus according to an embodiment. The display apparatus is different from the display apparatus described above with reference to FIG. 18 in that a length of the first additional vertical connection line DV1 in FIG. 25 is greater than that of the first additional vertical connection line DV1 in FIG. 18 and a length of the third additional vertical connection line DV3 in FIG. 25 is less than that of the third additional vertical connection line DV3 in FIG. 18.

As shown in FIG. 25, among the first to third horizontal connection lines DH1 to DH3, the first horizontal connection line DH1 may be the longest, and the third horizontal connection line DH3 may be the shortest. Therefore, the third additional vertical connection line DV3 electrically connected to the longest first horizontal connection line DH1 has the smallest length, and the first additional vertical connection line DV1 electrically connected to the shortest third horizontal connection line DH3 has the greatest length. Thus, the connecting length of the sixth data line DL6 and the sixth input line IL6, the connecting length of the fourth data line DL4 and the fourth input line IL4, and the connecting length of the second data line DL2 and the second input line IL2 may be substantially identical or similar to one another. As such, distortion of the data signals due to the voltage drop that is generated as the connecting lengths vary may be reduced.

According to one or more embodiments, the display apparatus in which high quality images may be displayed while reducing an area of a dead space, may be implemented. However, the scope of one or more embodiments is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a first semiconductor layer disposed on a substrate;
   a first gate layer disposed on the first semiconductor layer, the first gate layer including a driving gate electrode;
   a second gate layer disposed on the first gate layer, the second gate layer including a capacitor upper electrode;
   a first connecting electrode layer disposed on the second gate layer, the first connecting electrode layer including a transfer wiring;
   a second connecting electrode layer disposed on the first connecting electrode layer, the second connecting electrode layer including a horizontal connection wiring extending in a first direction;
   a third connecting electrode layer disposed on the second connecting electrode layer, the third connecting electrode layer including a vertical connection wiring extending in a second direction that intersects the first direction;
   a light-emitting diode including a pixel electrode disposed on the vertical connection wiring; and
   an insulating layer disposed between the vertical connection wiring and the pixel electrode of the light-emitting diode.

2. The display apparatus of claim 1, wherein
   the third connecting electrode layer includes a data wiring extending in the second direction, and
   the vertical connection wiring is electrically connected to the data wiring and the horizontal connection wiring.

3. The display apparatus of claim 2, wherein
   the substrate includes:
      a display area; and
      a peripheral area adjacent to the display area, and
   the vertical connection wiring is electrically connected to the data wiring in the peripheral area.

4. The display apparatus of claim 3, wherein the vertical connection wiring and the data wiring are integral with each other.

5. The display apparatus of claim 3, wherein the horizontal connection wiring is electrically connected to the vertical connection wiring in the display area.

6. The display apparatus of claim 3, wherein
   the vertical connection wiring is electrically connected to the horizontal connection wiring via a contact hole, and
   the second connecting electrode layer includes an auxiliary horizontal connection wiring that is spaced apart from the horizontal connection wiring to be electrically disconnected from the horizontal connection wiring and the data wiring and that extends parallel to the horizontal connection wiring.

7. The display apparatus of claim 3, wherein
   the vertical connection wiring is electrically connected to the horizontal connection wiring via a contact hole, and
   the third connecting electrode layer includes an auxiliary vertical connection wiring that is spaced apart from the vertical connection wiring to be electrically disconnected from the horizontal connection wiring and the vertical connection wiring and that extends parallel to the vertical connection wiring.

8. The display apparatus of claim 3, wherein the third connecting electrode layer includes an additional vertical connection wiring that extends in the second direction and is electrically connected to the horizontal connection wiring in the display area.

9. The display apparatus of claim 8, wherein the third connecting electrode layer includes an auxiliary additional vertical connection wiring that is spaced apart from the additional vertical connection wiring to be electrically disconnected from the horizontal connection wiring and the additional vertical connection wiring and that extends parallel to the additional vertical connection wiring.

10. The display apparatus of claim 1, wherein
the third connecting electrode layer includes a data wiring extending in the second direction,
the substrate includes:
a display area; and
a peripheral area adjacent to the display area, and
the horizontal connection wiring is electrically connected to the data wiring in the display area.

11. The display apparatus of claim 10, wherein the data wiring is electrically connected to the horizontal connection wiring via a contact hole.

12. The display apparatus of claim 11, wherein the second connecting electrode layer includes an auxiliary horizontal connection wiring that is spaced apart from the horizontal connection wiring to be electrically disconnected from the horizontal connection wiring and the data wiring and that extends parallel to the horizontal connection wiring.

13. The display apparatus of claim 10, wherein the vertical connection wiring is electrically connected to the data wiring and the horizontal connection wiring.

14. The display apparatus of claim 13, wherein the vertical connection wiring intersects the horizontal connection wiring.

15. The display apparatus of claim 10, wherein the third connecting electrode layer includes an additional vertical connection wiring that extends in the second direction and is electrically connected to the horizontal connection wiring in the display area.

16. The display apparatus of claim 15, wherein the third connecting electrode layer includes an auxiliary additional vertical connection wiring that is spaced apart from the additional vertical connection wiring to be electrically disconnected from the horizontal connection wiring and the additional vertical connection wiring and that extends parallel to the additional vertical connection wiring.

17. A display apparatus comprising:
a first semiconductor layer disposed on a substrate;
a first gate layer disposed on the first semiconductor layer, the first gate layer including a driving gate electrode;
a second gate layer disposed on the first gate layer, the second gate layer including a capacitor upper electrode;
a first connecting electrode layer disposed on the second gate layer, the first connecting electrode layer including a transfer wiring;
a second connecting electrode layer disposed on the first connecting electrode layer, the second connecting electrode layer including a horizontal connection wiring extending in a first direction;
a third connecting electrode layer disposed on the second connecting electrode layer, the third connecting electrode layer including a vertical connection wiring extending in a second direction that intersects the first direction;
a second semiconductor layer between the second gate layer and the first connecting electrode layer; and
a third gate layer between the second semiconductor layer and the first connecting electrode layer, the third gate layer including a compensation gate electrode.

18. The display apparatus of claim 17, wherein the third gate layer includes a gate wiring extending in the first direction.

19. The display apparatus of claim 18, wherein, the gate wiring intersects the vertical connection wiring.

20. The display apparatus of claim 17, wherein
the first semiconductor layer includes polysilicon, and
the second semiconductor layer includes an oxide semiconductor.

21. A display apparatus comprising:
an organic light-emitting diode;
a driving transistor that controls an amount of current flowing from a first node to the organic light-emitting diode in response to a voltage applied to a second node, the first node being electrically connected to a driving voltage line;
a switching transistor that transfers a data signal from a data line to the first node, in response to a voltage applied to a scan line;
an initialization transistor that applies an initialization voltage from an initialization voltage line to the second node, in response to a voltage applied to a previous scan line, the initialization transistor including an initialization semiconductor layer disposed on an insulating layer that overlaps a driving semiconductor layer included in the driving transistor;
a transfer wiring disposed on an insulating layer that overlaps an initialization gate electrode included in the initialization transistor, the transfer wiring electrically connecting the initialization semiconductor layer to a driving gate electrode included in the driving transistor;
a horizontal connection wiring disposed on an insulating layer that overlaps the transfer wiring and extending in a first direction; and
a vertical connection wiring disposed on an insulating layer that overlaps the horizontal connection wiring and extending in a second direction intersecting the first direction.

22. The display apparatus of claim 21, wherein the vertical connection wiring is electrically connected to the horizontal connection wiring via a contact hole formed in the insulating layer that overlaps the horizontal connection wiring.

23. The display apparatus of claim 21, wherein
the driving semiconductor layer includes polysilicon, and
the initialization semiconductor layer includes an oxide semiconductor.

24. The display apparatus of claim 21, wherein the data line and the vertical connection wiring are disposed on a same layer.

25. The display apparatus of claim 24, wherein the data line extends in the second direction.

26. The display apparatus of claim 21, wherein the driving voltage line and the vertical connection wiring are disposed on a same layer.

* * * * *